(12) United States Patent
Shibazaki

(10) Patent No.: US 7,927,428 B2
(45) Date of Patent: Apr. 19, 2011

(54) CLEANING MEMBER, CLEANING METHOD, AND DEVICE MANUFACTURING METHOD

(75) Inventor: Yuichi Shibazaki, Kumagaya (JP)

(73) Assignee: Nikon Corporation, Tokyo (JP)

(*) Notice: Subject to any disclaimer, the term of this patent is extended or adjusted under 35 U.S.C. 154(b) by 285 days.

(21) Appl. No.: 11/851,864

(22) Filed: Sep. 7, 2007

(65) Prior Publication Data

US 2008/0202555 A1 Aug. 28, 2008

(30) Foreign Application Priority Data

Sep. 8, 2006 (JP) ................................. P2006-244271

(51) Int. Cl.
*B08B 3/04* (2006.01)

(52) U.S. Cl. .............................. 134/32; 134/34

(58) Field of Classification Search ............... 134/6, 21, 134/32, 34, 42; 355/30
See application file for complete search history.

(56) References Cited

U.S. PATENT DOCUMENTS

| | | | |
|---|---|---|---|
| 4,509,852 A | 4/1985 | Tabarelli et al. | |
| 5,969,441 A | 10/1999 | Loopstra et al. | |
| 6,341,007 B1 | 1/2002 | Nishi et al. | |
| 6,400,441 B1 | 6/2002 | Nishi et al. | |
| 6,496,257 B1 | 12/2002 | Taniguchi et al. | |
| 6,549,269 B1 | 4/2003 | Nishi et al. | |
| 6,590,634 B1 | 7/2003 | Nishi et al. | |
| 6,611,316 B2 | 8/2003 | Sewell | |
| 6,778,257 B2 | 8/2004 | Bleeker et al. | |
| 7,050,146 B2 | 5/2006 | Duineveld et al. | |
| 7,091,502 B2 | 8/2006 | Gau et al. | |
| 7,199,858 B2 | 4/2007 | Lof et al. | |
| 7,224,427 B2 | 5/2007 | Chang et al. | |
| 7,224,434 B2 | 5/2007 | Tokita | |
| 7,307,263 B2 | 12/2007 | Bakker et al. | |
| 7,315,033 B1 | 1/2008 | Pawloski et al. | |
| 7,385,670 B2 | 6/2008 | Compen et al. | |
| 7,405,417 B2 | 7/2008 | Stevens et al. | |
| 7,462,850 B2 | 12/2008 | Banine et al. | |
| 2004/0207824 A1 | 10/2004 | Lof et al. | |

(Continued)

FOREIGN PATENT DOCUMENTS

CN 1963673 5/2007

(Continued)

OTHER PUBLICATIONS

Computer Translation of JP 2006-134999 to Shimizu et al., published May 25, 2006.*

(Continued)

*Primary Examiner* — Michael Kornakov
*Assistant Examiner* — Ryan Coleman
(74) *Attorney, Agent, or Firm* — Staas & Halsey LLP

(57) ABSTRACT

A method of cleaning at least a portion of an exposure system's substrate-holding member. The method involves using the substrate-holding member to hold a cleaning member having substantially the same external shape as a substrate processed with the exposure system. The outer diameter of the cleaning member is smaller than the outer diameter of the substrate processed with the exposure system, and as a result, when the substrate-holding member holds the cleaning member, a gap is provided from the outer diameter of the cleaning member to another member which surrounds the substrate when the substrate-holding member is used to hold a substrate. Liquid is supplied to a space over the gap in order to clean at least a portion of the substrate-holding member.

34 Claims, 14 Drawing Sheets

U.S. PATENT DOCUMENTS

| | | |
|---|---|---|
| 2005/0024609 A1 | 2/2005 | De Smit et al. |
| 2005/0028314 A1* | 2/2005 | Hickman et al. ............... 15/302 |
| 2005/0175776 A1 | 8/2005 | Streefkerk et al. |
| 2005/0264774 A1 | 12/2005 | Mizutani et al. |
| 2005/0274898 A1 | 12/2005 | Watanabe et al. |
| 2006/0023185 A1 | 2/2006 | Hazelton et al. |
| 2006/0050351 A1 | 3/2006 | Higashiki |
| 2006/0077367 A1 | 4/2006 | Kobayashi et al. |
| 2006/0081273 A1 | 4/2006 | McDermott et al. |
| 2006/0103818 A1 | 5/2006 | Holmes et al. |
| 2006/0132731 A1 | 6/2006 | Jansen et al. |
| 2006/0232757 A1 | 10/2006 | Tani et al. |
| 2006/0250588 A1 | 11/2006 | Brandl |
| 2006/0256316 A1 | 11/2006 | Tanno et al. |
| 2007/0002296 A1 | 1/2007 | Chang et al. |
| 2007/0026345 A1 | 2/2007 | Subramanian et al. |
| 2007/0064215 A1 | 3/2007 | Dirksen et al. |
| 2007/0076197 A1 | 4/2007 | Koga |
| 2007/0085989 A1 | 4/2007 | Nagahashi et al. |
| 2007/0091287 A1 | 4/2007 | Chang et al. |
| 2007/0127001 A1 | 6/2007 | Van Der Hoeven |
| 2007/0146657 A1 | 6/2007 | Mierlo et al. |
| 2007/0146658 A1 | 6/2007 | Van Mierlo et al. |
| 2007/0159610 A1 | 7/2007 | Shiraishi |
| 2007/0172234 A1 | 7/2007 | Shigemori et al. |
| 2007/0206279 A1 | 9/2007 | Brueck et al. |
| 2007/0229786 A1 | 10/2007 | Kemper et al. |
| 2007/0229789 A1 | 10/2007 | Kawamura |
| 2007/0247600 A1 | 10/2007 | Kobayashi et al. |
| 2007/0251543 A1 | 11/2007 | Singh |
| 2007/0253710 A1 | 11/2007 | Kaneyama et al. |
| 2007/0258072 A1 | 11/2007 | Nagasaka et al. |
| 2007/0274711 A1 | 11/2007 | Kaneyama et al. |
| 2007/0285631 A1 | 12/2007 | Stavenga et al. |
| 2008/0002162 A1 | 1/2008 | Jansen et al. |
| 2008/0049201 A1 | 2/2008 | Stavenga et al. |
| 2008/0218712 A1 | 9/2008 | Compen et al. |
| 2008/0273181 A1 | 11/2008 | De Jong et al. |
| 2008/0284990 A1 | 11/2008 | De Jong et al. |
| 2009/0025753 A1 | 1/2009 | De Jong et al. |
| 2009/0027635 A1 | 1/2009 | De Jong et al. |
| 2009/0027636 A1 | 1/2009 | Leenders et al. |
| 2009/0091716 A1 | 4/2009 | Kadijk et al. |

FOREIGN PATENT DOCUMENTS

| | | |
|---|---|---|
| EP | 1 420 298 | 5/2004 |
| EP | 1 420 300 | 5/2004 |
| EP | 1 783 821 | 5/2007 |
| EP | 1 783 822 | 5/2007 |
| EP | 1 793 276 | 6/2007 |
| EP | 1 814 144 | 8/2007 |
| JP | 5-82411 | 4/1993 |
| JP | 10-163099 | 6/1998 |
| JP | 10-214783 | 8/1998 |
| JP | 11-135400 | 5/1999 |
| JP | 2000-505958 | 5/2000 |
| JP | 2000-164504 | 6/2000 |
| JP | 2000-323396 | 11/2000 |
| JP | 2004-519850 | 7/2004 |
| JP | 2004-289127 | 10/2004 |
| JP | 2004-327484 | 11/2004 |
| JP | 2005-72404 | 3/2005 |
| JP | 2005-79222 | 3/2005 |
| JP | 2006-134999 | 5/2006 |
| JP | 2006-173527 | 6/2006 |
| JP | 2006-310706 | 11/2006 |
| JP | 2007-29973 | 2/2007 |
| JP | 2007-72118 | 3/2007 |
| JP | 2007-88328 | 4/2007 |
| JP | 2007-142217 | 6/2007 |
| JP | 2007-150102 | 6/2007 |
| JP | 2007-227543 | 9/2007 |
| JP | 2007-227580 | 9/2007 |
| WO | WO 99/49504 | 9/1999 |
| WO | WO 01/35168 | 5/2001 |
| WO | WO 02/069049 | 9/2002 |
| WO | WO 2004/019128 | 3/2004 |
| WO | WO 2005/059617 | 6/2005 |
| WO | WO 2005/059618 | 6/2005 |
| WO | WO 2005/122218 | 12/2005 |
| WO | WO 2005/124833 | 12/2005 |
| WO | WO 2006/041086 | 4/2006 |
| WO | WO 2006/046562 | 5/2006 |
| WO | WO2006/062065 | 6/2006 |
| WO | WO 2006/122578 | 11/2006 |
| WO | WO 2007/006447 | 1/2007 |
| WO | WO 2007/135990 | 11/2007 |
| WO | WO 2007/136089 | 11/2007 |
| WO | WO 2008/001871 | 1/2008 |

OTHER PUBLICATIONS

International Search Report issued on the related PCT Application (PCT/JP2007/067426) on Dec. 18, 2007.

Written Opinion of the International Search Authority issued on the related PCT Application (PCT/JP2007/067426) on Dec. 18, 2007.

* cited by examiner

CLEANING MEMBER, CLEANING METHOD, AND DEVICE MANUFACTURING METHOD

CROSS-REFERENCE TO RELATED APPLICATION

The present application claims priority on Japanese Patent Application No. 2006-244271, filed Sep. 8, 2006, the content of which is incorporated herein by reference.

BACKGROUND

1. Field of the Invention

The present invention relates to a cleaning member for cleaning a substrate-holding member that holds a substrate, a cleaning method, and a device manufacturing method.

2. Related Art

As an exposure apparatus used in a photolithography process, an immersion exposure apparatus that exposes a substrate via liquid is conventionally known, and is disclosed, for example, in PCT International Publication No. WO 99/49504 and Japanese Patent Application, Publication No. 2004-289127.

In an immersion exposure apparatus, when liquid infiltrates into places such as a gap between a substrate and a substrate-holding member, there is a possibility that part of the substrate-holding member be polluted by the infiltrating liquid, or by foreign bodies and impurities that have become mixed in the liquid. If the substrate-holding member is left in this polluted state, there are possibilities that it will become unable to properly hold the substrate, that the substrate it holds will become polluted, and that pollution will spread. Such problems can make it impossible to properly expose the substrate.

A purpose of some aspects of the invention is to provide a cleaning member and a cleaning method that can properly clean a substrate-holding member. Another purpose is to provide a method of manufacturing a device by holding a substrate in a substrate-holding member that is cleaned in that manner.

SUMMARY

According to a first aspect of the invention, there is provided a cleaning member for cleaning at least part of a substrate-holding member that holds a rear face of a substrate onto which exposure light is irradiated, the cleaning member being held by the substrate-holding member, and having an outer diameter that is smaller than the substrate.

According to the first aspect of the invention, the substrate-holding member can be properly cleaned.

According to a second aspect of the invention, there is provided a cleaning method of cleaning at least part of the substrate-holding member by holding the above-described cleaning member with the substrate-holding member.

According to the second aspect of the invention, the substrate-holding member can be properly cleaned.

According to a third aspect of the invention, there is provided a cleaning method of cleaning at least part of a substrate-holding member that holds a substrate onto which exposure light is irradiated, the method comprising: holding a cleaning member with the substrate-holding member, the cleaning member having substantially the same external shape as the substrate, and an outer diameter that is smaller than the substrate; and supplying a liquid that is used for cleaning at least part of the substrate-holding member.

According to the third aspect of the invention, the substrate-holding member can be properly cleaned.

According to a fourth aspect of the invention, there is provided a device manufacturing method comprising: cleaning a substrate-holding member using the cleaning method described above; holding a substrate by use of the substrate-holding member; and exposing the substrate held by the substrate-holding member with exposure light.

According to the fourth aspect of the invention, by holding the substrate with a properly cleaned substrate-holding member and exposing the substrate to light, it is possible to manufacture a device having a desired performance.

DESCRIPTION OF EMBODIMENTS

While the invention will now be explained with reference to the drawings, these are not limitative of the invention. In the explanation below, positional relationships between various members are explained with reference to an XYZ orthogonal coordinate system. A predetermined direction in the horizontal plane is deemed an X-axis direction, a direction orthogonal to the X-axis direction in the horizontal plane is deemed a Y-axis direction, and a direction orthogonal to the X-axis direction and the Y-axis direction (i.e. a vertical direction) is deemed a Z-axis direction. Rotational (gradient) directions about the X-axis, the Y-axis, and the Z-axis are respectively deemed θX, θY, and θZ.

First Embodiment

Figure 1:
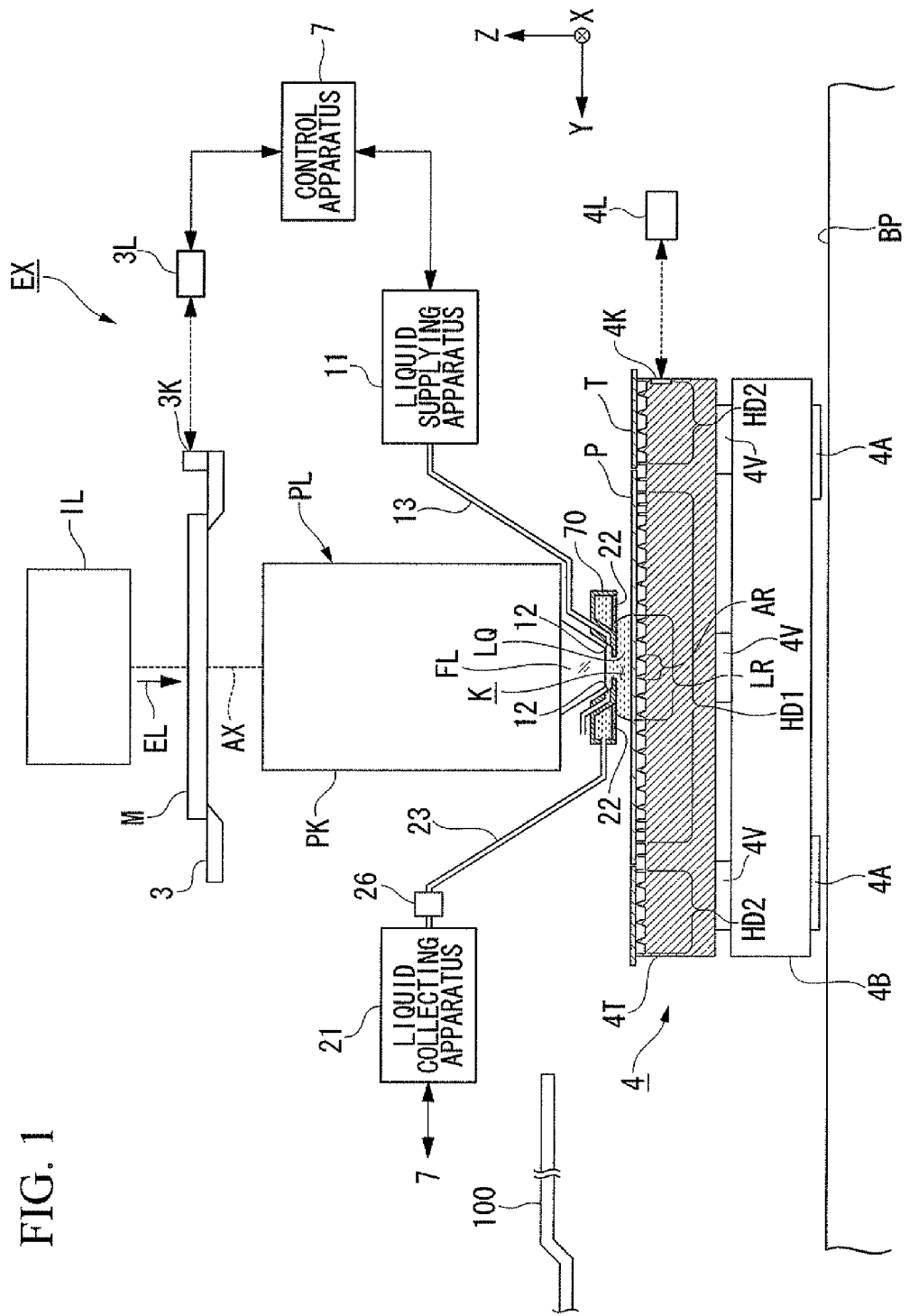
FIG. 1 is a view of a general configuration of an exposure apparatus according to a first embodiment.

A first embodiment will be explained. FIG. 1 is a view of a general configuration of an exposure apparatus EX according to a first embodiment. In FIG. 1, the exposure apparatus EX includes a movable mask stage 3 that holds a mask M, a movable substrate stage 4 that holds a substrate P for exposure, an illumination system IL that illuminates the mask M with exposure light EL, a projection optical system PL that projects an image of a pattern of the mask M illuminated by the exposure light EL onto the substrate P, a conveying device 100 that can convey the substrate P with respect to the substrate stage 4, and a control apparatus 7 that controls the overall exposure apparatus EX.

The substrate P for exposure here is used in manufacturing a device and includes, for example, a substrate made by applying a photosensitive material (photo resist) to a base material as in the case of a semiconductor wafer such as a silicon wafer, or a substrate to which, in addition to a photosensitive material, one or more various types of films such as a protective film (top coat film) is applied. The substrate P for exposure is a disk-like member whose outer shape in the XY horizontal plane is circular. The mask M includes a reticle where a device pattern projected onto the substrate P for exposure is formed. While this embodiment uses a transmission type mask, a non-reflective mask can be used instead. A transmission type mask is not limited to a binary mask where a pattern is formed by a light-intercepting film, and also includes, for example, a halftone type or a phase shift mask such as spatial frequency modulation type.

The exposure apparatus EX of this embodiment is an immersion exposure apparatus using an immersion method that enhances resolution by substantially shortening the exposure length, and substantially widens the focal depth. The exposure apparatus EX includes a nozzle member 70 that is arranged facing a top face of the substrate P, and can form an immersion space LR between itself and the top face of the substrate P. The immersion space LR is filled with a liquid LQ. The nozzle member 70 has a bottom face that is opposite the top face of the substrate P, and the liquid LQ can be held between this bottom face and the top face of the substrate P. The nozzle member 70 holds the liquid LQ between its bottom face and the top face of the substrate P, enabling the immersion space LR of the liquid LQ to be formed between the nozzle member 70 and the substrate P.

The nozzle member 70 forms the immersion space LR such that the liquid LQ is filled into an optical path space K of the exposure light EL on the image plane side (light-emitting side) of the projection optical system PL, specifically, the optical path space K of the exposure light EL between a light-emitting face (bottom face) of a terminal optical element FL nearest the image plane of the projection optical system PL among a plurality of optical elements of the projection optical system PL and the substrate P arranged on the image plane side of the projection optical system PL. The optical path space K of the exposure light EL contains an optical path which the exposure light EL travels along. In this embodiment, water (pure water) is used as the liquid LQ.

The exposure apparatus EX uses the nozzle member 70 to form the immersion space LR at least while an image of the pattern of the mask M is being projected onto the substrate P. The exposure apparatus EX forms the immersion space LR such that the optical path space K of the exposure light EL is filled with the liquid LQ, and exposes the substrate P by irradiating the exposure light EL passing through the mask M via the liquid LQ onto the substrate P held by the substrate stage 4. A pattern image of the mask M is thereby projected onto the substrate P.

The exposure apparatus EX of this embodiment utilizes a local immersion method of forming the immersion space LR between the nozzle member 70 and the substrate P such that one region on the substrate P including a projection region AR of the projection optical system PL is covered by the liquid LQ, at least while the image of the pattern of the mask M is being projected onto the substrate P. That is, the nozzle member 70 functions as a liquid confinement member that confines the liquid LQ on the image plane side of the projection optical system PL.

While this embodiment describes a case where the nozzle member 70 forms the immersion space LR between itself and the top face of the substrate P, the nozzle member 70 can form the immersion space LR at the image plane side of the projection optical system PL between itself and the top face of an object provided at a position where the exposure light EL can be irradiated, that is, between itself and the top face of an object provided at a position opposite the light-emitting face of the projection optical system PL. For example, the nozzle member 70 can form the immersion space LR between itself and a top face (plate member T) of the substrate stage 4, and between itself and a cleaning member CP explained later.

The illumination system IL illuminates a predetermined illumination region on the mask M with exposure light EL having uniform illuminance distribution. For example, the exposure light EL emitted from the illumination system IL can be deep ultraviolet light (DUV) such as bright-lines (g-line, h-line, i-line) emitted from a mercury lamp and KrF excimer laser light (wavelength 248 nm), vacuum ultraviolet light (VUV) such as ArF excimer laser light (wavelength 193 nm) and F2 laser light (wavelength 157 nm), and the like. In this embodiment, ArF excimer laser light is used as the exposure light EL.

The mask stage 3 can move in the X-axis, Y-axis, and θZ directions while holding the mask M by the operation of a mask stage driving device that includes an actuator such as a linear motor. Positional information relating to the mask stage 3 (and the mask M) is measured by a laser interferometer 3L. The laser interferometer 3L measures positional information of the mask stage 3 using a measuring mirror 3K arranged on the mask stage 3. The control apparatus 7 drives the mask stage driving device based on the measurements of the laser interferometer 3L, and controls the position of the mask M held on the mask stage 3.

The projection optical system PL projects an image of the pattern of the mask M onto the substrate P at a predetermined projection magnification. The projection optical system PL includes a plurality of optical elements which are held in a lens barrel PK. The projection optical system PL of this embodiment is a reduction system with a projection magnification of, for example, ¼, ⅕, or ⅛. The projection optical system PL can be any of a reduction system, an equal system, and a magnification system. In this embodiment, an optical axis AX of the projection optical system PL is parallel to the Z-axis direction. The projection optical system PL can be any of a refractive system that does not include reflective optical elements, a reflective system that does not include refractive optical elements, and a catadioptric system that includes reflective optical elements and refractive optical elements. The projection optical system PL can form either an inverted image or an erected image.

The substrate stage 4 includes a stage body 4B, a table 4T mounted on the stage body 4B, a first holder HD1 that is fitted to the table 4T and removably holds the substrate P, a plate member T that is arranged such as to surround the perimeter of the substrate P held by the first holder HD1, and a second holder HD2 that is fitted to the table 4T and removably holds the plate member T.

Air bearings 4A support the stage body 4B with respect to a top face (guide face) of a base member BP in a state of non-contact therewith. The top face of the base member BP is substantially parallel to the XY plane, and the substrate stage 4 can move in the XY direction on the base member BP.

A substrate stage driving device includes an actuator such as a linear motor, and the substrate stage 4 can move above the base member BP while the first holder HD1 is holding the substrate P. The substrate stage driving device includes a first driving system that can move the table 4T mounted on the stage body 4B in the X-axis, the Y-axis, and the θZ direction, and a second driving system that can move the table 4T with respect to the stage body 4B in the Z-axis, θX, and θY directions, by moving the stage body 4B on the base member BP along the X-axis, the Y-axis, and the θZ direction.

The first driving system includes an actuator such as a linear motor, and can move the stage body 4B in the X-axis, the Y-axis, and the θZ direction. The second driving system is provided between the stage body 4B and the table 4T, and includes, for example, actuators 4V such as voice coil motors, and a measuring device (e.g. an encoder; not shown) for measuring the drive amount of each actuator. The table 4T is supported on the stage body 4B by at least three actuators 4V. Each of the actuators 4V can drive the table 4T independently in the Z-axis direction with respect to the stage body 4B, and the control apparatus 7 drives the table 4T in the Z-axis, the θX, and the θY directions with respect to the stage body 4B by adjusting the drive amounts of the three actuators 4V. Thus the substrate stage driving device including the first and second driving systems can move the table 4T of the substrate stage 4 in six degrees of freedom (X-axis, Y-axis, Z-axis, θX, θY, and θZ directions). By controlling the substrate stage driving device, the control unit 7 can control the position relating to the six-degree-of-freedom directions of the top face of the substrate for exposure P held by the first holder HD1 of the table 4T.

Positional information of the table 4T (substrate P) of the substrate stage 4 is measured by a laser interferometer 4L. The laser interferometer 4L uses a measuring mirror 4K fitted to the table 4T to measure positional information of the table 4T in the X-axis, the Y-axis, and the θZ direction. Surface positional information (positional information relating to the Z-axis, θX, and θY directions) of the top face of the substrate P held by the first holder HD1 of the table 4T is detected by a focus/leveling detection system (not shown). Based on measurements taken by the laser interferometer 4L and the detected result of the focus-leveling detection system, the control apparatus 7 drives the substrate stage driving device, and controls the position of the substrate P held by the first holder HD1.

The nozzle member 70 includes a liquid supply port 12 that can supply the liquid LQ, and a liquid collection port 22 that can collect the liquid LQ. A porous member (mesh) is provided at the liquid collection port 22. The liquid supply port 12 is connected via a supply flowpath formed inside the nozzle member 70, and a supply pipe 13, to a liquid supplying device 11 that can deliver the liquid LQ. The liquid collection port 22 is connected via a collection flowpath formed inside the nozzle member 70, and a collection pipe 23, to a liquid collecting device 21 that can collect the liquid LQ.

The liquid supplying device 11 can deliver clean, temperature-adjusted liquid LQ. The liquid collecting device 21 includes a vacuum system and the like, and can collect the liquid LQ. Operations of the liquid supplying device 11 and the liquid collecting device 21 are controlled by the control apparatus 7. Liquid LQ delivered from the liquid supplying device 11 flows along the supply pipe 13 and the supply flowpath of the nozzle member 70, and is supplied from the liquid supply port 12 into the optical path space K of the exposure light EL. Liquid LQ that is collected from the liquid collection port 22 by driving the liquid collecting device 21 flows along the collection flowpath of the nozzle member 70, passes along the collection pipe 23, and is collected by the liquid collecting device 21. The control apparatus 7 controls the operation of supplying liquid from the liquid supply port 12 in parallel with the operation of collecting liquid from the liquid collection port 22, and forms the immersion space LR of the liquid LQ such that the optical path space K of the exposure light EL between the terminal optical element FL and the substrate P is filled with the liquid LQ. Incidentally, the configuration of the nozzle member 70 is not limited to that described above, it being possible to use, for example, a member disclosed in Japanese Patent Application, Publication No. 2004-289127 (corresponding U.S. Pat. No. 7,199,858).

In this embodiment, the exposure apparatus EX includes a detecting device 26 that can detect the quality (water quality) of the liquid LQ collected from the liquid collection port 22. The detecting device 26 includes, for example, a TOC gauge for measuring total organic carbon in the liquid LQ, a particle counter for measuring foreign bodies including tiny particles and air bubbles, and the like, and can detect pollution or contamination state of the liquid LQ collected from the liquid collection port 22.

Figure 2:
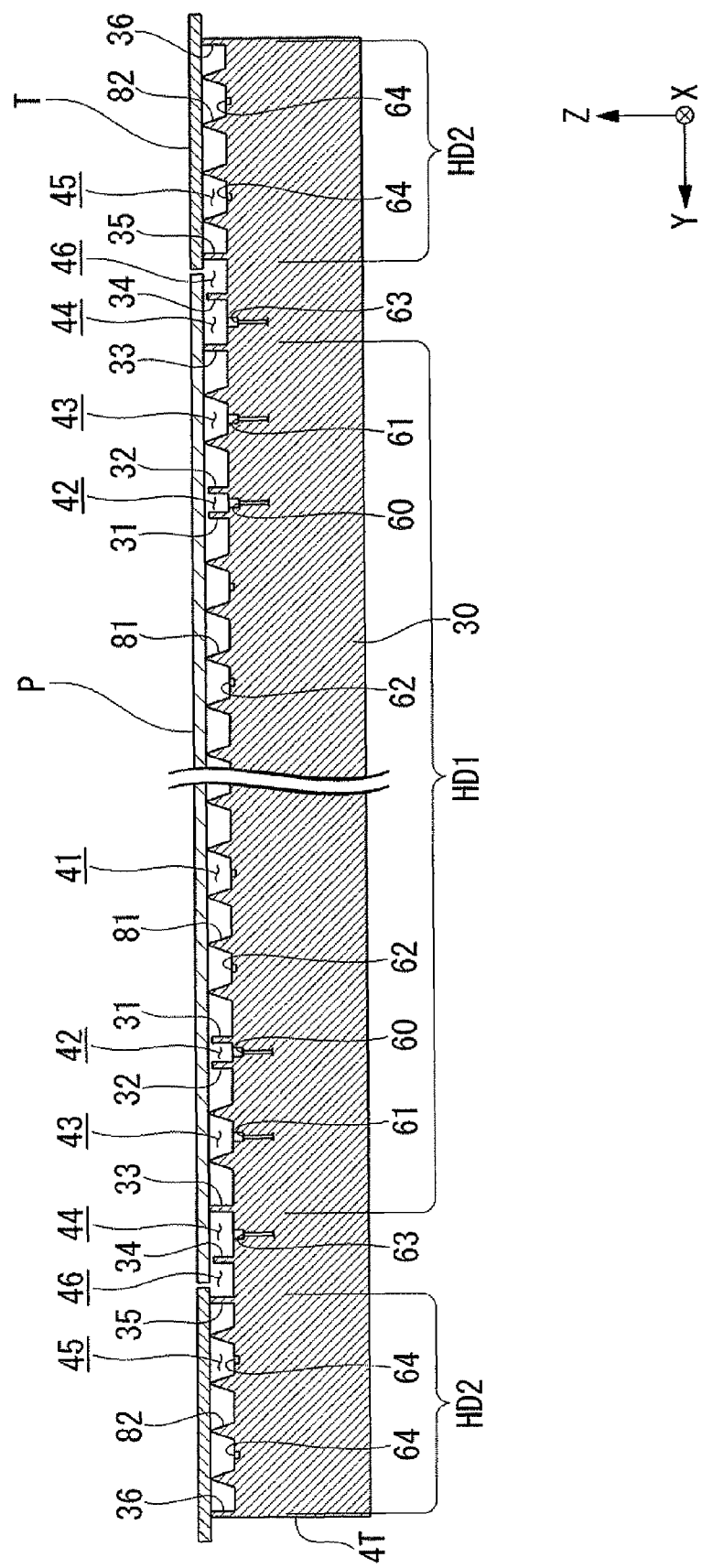
FIG. 2 is a side cross-sectional view of a table according to the first embodiment.
Figure 3:
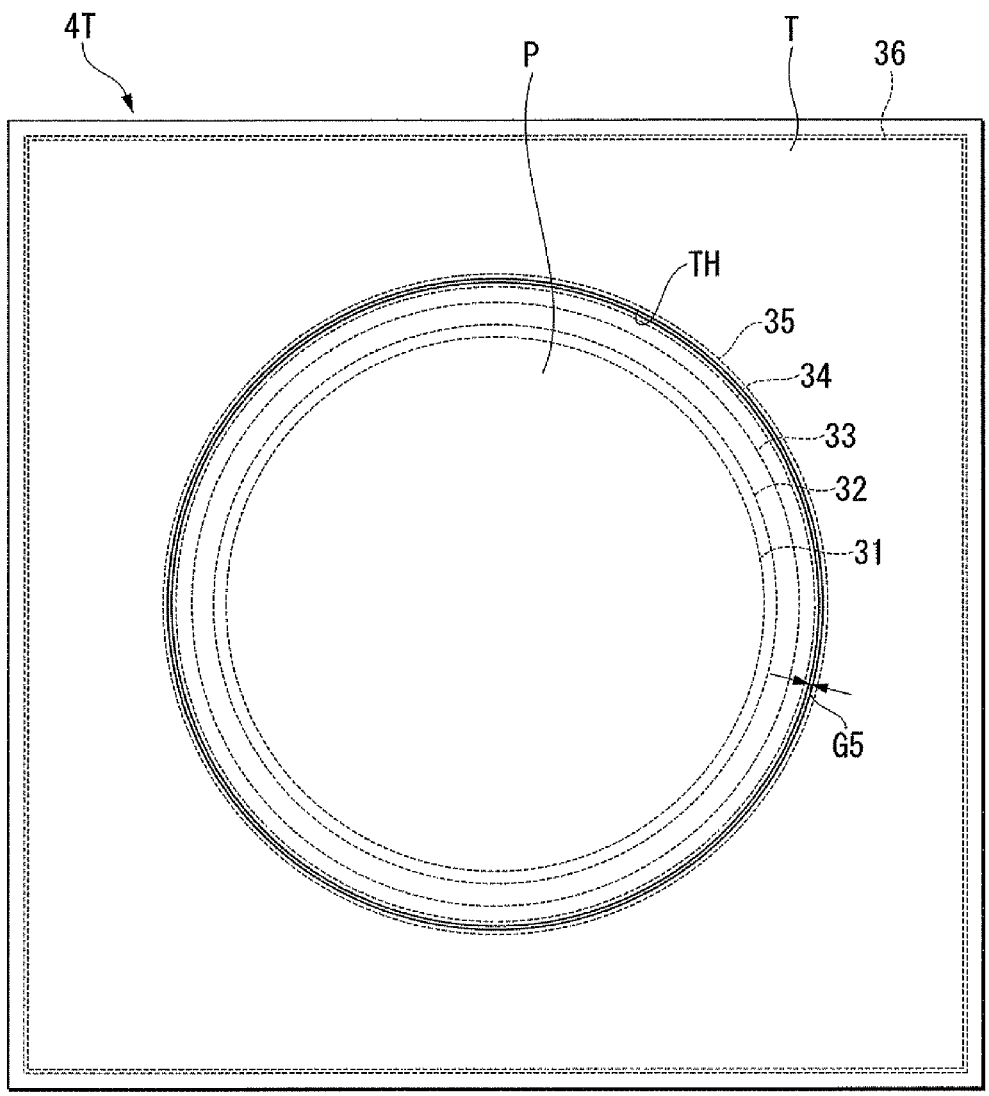
FIG. 3 is a plan view of a table during a state of holding a substrate.
Figure 3:
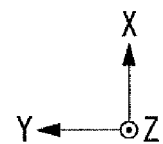
Figure 4:
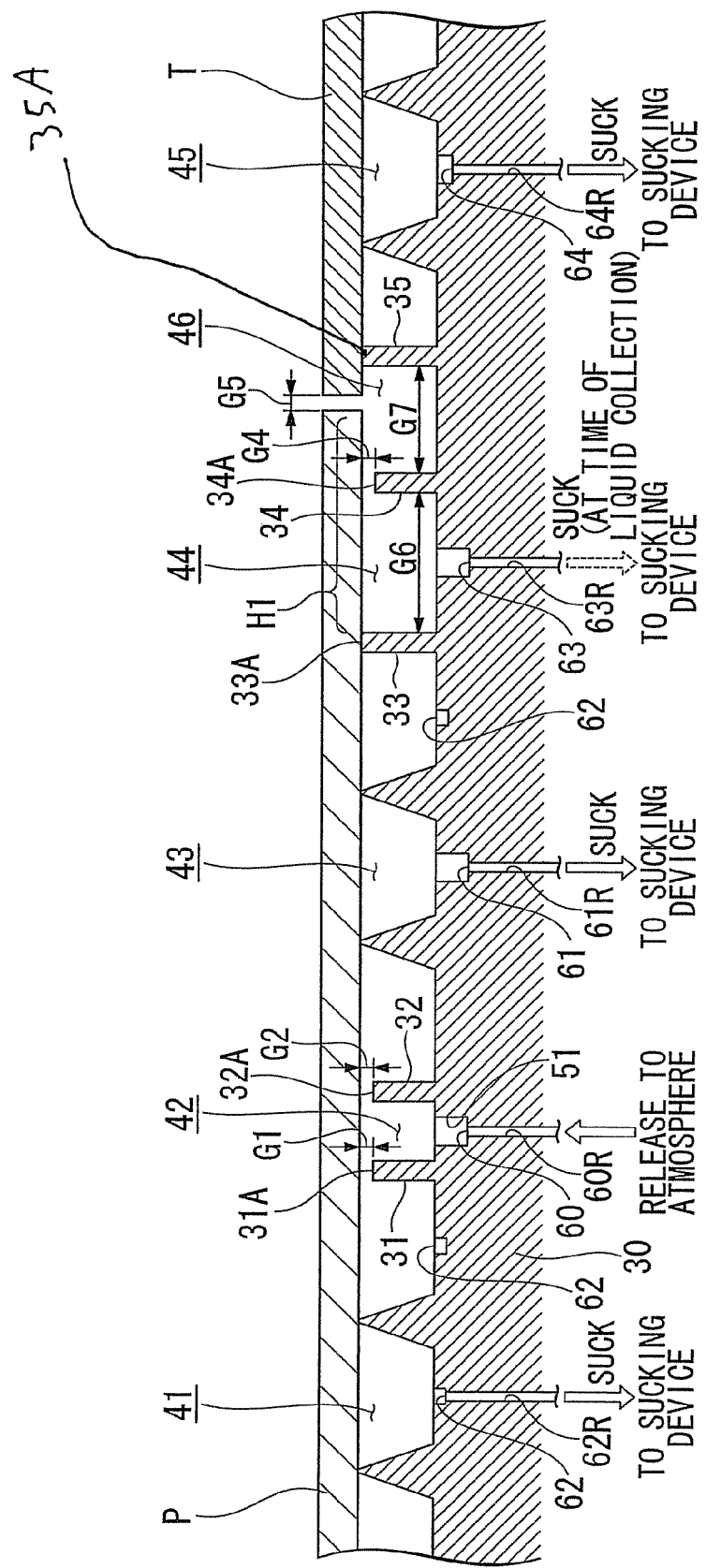
FIG. 4 is a side cross-sectional view of primary parts of a table according to the first embodiment.

Subsequently, the table 4T according to this embodiment will be explained with reference to FIGS. 1 to 4. FIG. 2 is a side cross-sectional view of the table 4T when the first holder HD1 is holding the substrate P, FIG. 3 is a plan view taken from above the table 4T when the first holder HD1 is holding the substrate P, and FIG. 4 is a side cross-sectional view of an enlarged part of the first holder HD1.

The table 4T includes a base 30, the first holder HD1 that is fitted to the base 30 and removably holds the substrate P, and the second holder HD2 that is fitted to the base 30 and removably holds the plate member T. The plate member T held by the second holder HD2 is disposed such as to surround the perimeter of the substrate P held by the first holder HD1.

The first holder HD1 will be explained. As shown in FIGS. 2 to 4, the first holder HD1 includes a first peripheral wall 33 that is formed on the base 30 and has a first top face 33A that is opposite a perimeter region of a rear face of the substrate P held by the first holder HD1, a second peripheral wall 34 that is formed on the base 30, has a second top face 34A that is opposite the rear face of the substrate P held by the first holder HD1, and is disposed such as to surround the first peripheral wall 33, and first supporting members 81 that are disposed at the inner side (medial side) of the first peripheral wall 33 and supports the rear face of the substrate P. The first supporting members 81 are formed on a top face of the base 30 at the inner side of the first peripheral wall 33.

Furthermore, the first holder HD1 includes a third peripheral wall 31 that is formed on the base 30, has a third top face 31A that is opposite the rear face of the substrate P, and is disposed such as to surround a first space 41 between the substrate P held by the first holder HD1 and the base 30, and a fourth peripheral wall 32 that is formed on the base 30, has a fourth top face 32A that is opposite the rear face of the substrate P held by the first holder HD1, and is disposed such as to surround the third peripheral wall 31. The first peripheral wall 33 is disposed such as to surround the fourth peripheral wall 32.

The first holder HD1 also includes a first suction hole 63 that is formed at the outer side of the first peripheral wall 33 and can suck fluid (at least one of fluid and ga), and a second suction hole 61 that is formed at the inner side (medial side) of the first peripheral wall 33 and can suck fluid (at least one of fluid and gas). The first suction hole 63 and the second suction hole 61 are each formed on the top face of the base 30.

In this embodiment the first suction hole 63 is formed between the first peripheral wall 33 and the second peripheral wall 34, and can suck fluid from a fourth space 44 between the first peripheral wall 33 and the second peripheral wall 34. The second suction hole 61 is formed between the first peripheral wall 33 and the fourth peripheral wall 32, and can suck fluid from a third space 43 between the first peripheral wall 33 and the fourth peripheral wall 32.

The first holder HD1 also includes a flow port 60 that enables gas to be supplied to a second space 42 between the third peripheral wall 31 and the fourth peripheral wall 32. The flow port 60 is formed on the top face of the base 30.

The third peripheral wall 31 is formed in a ring-shape substantially similar to the external shape of the substrate P. The third top face 31A of the third peripheral wall 31 is arranged such that it is opposite a region that is relatively at the outer side of the rear face of the substrate P held by the first holder HD1. The first space 41 is formed on the rear face side of the substrate P held by the first holder HD1, and is surrounded by the rear face of the substrate P, the third peripheral wall 31, and the base 30.

The fourth peripheral wall 32 is formed in a ring-shape substantially similar to the external shape of the substrate P, and runs along the third peripheral wall 31 at a predetermined distance thereto. The fourth top face 32A of the fourth peripheral wall 32 is arranged such as to be opposite a region that is relatively at the outer side of the rear face of the substrate P held by the first holder HD1. The second space 42 is formed on the rear face side of the substrate P held by the first holder HD1, and is surrounded by the rear face of the substrate P, the third peripheral wall 31, the fourth peripheral wall 32, and the base 30.

The first peripheral wall 33 is formed in a ring-shape substantially similar to the external shape of the substrate P, and runs along the fourth peripheral wall 32 at a predetermined distance thereto. The first top face 33A of the first peripheral wall 33 is arranged such as to be opposite a peripheral region of the rear face of the substrate P held by the first holder HD1. The third space 43 is formed on the rear face side of the substrate P held by the first holder HD1, and is surrounded by the rear face of the substrate P, the fourth peripheral wall 32, the first peripheral wall 33, and the base 30.

In this embodiment, the diameter (outer diameter) of the outer rim of the first top face 33A of the first peripheral wall 33 is smaller than the outer diameter of the substrate P. The peripheral region of the substrate P overhangs to the outer side of the outer rim of the first top face 33A by a predetermined amount. In the explanation below, the region, of the substrate P held by the first holder HD1, that overhangs to the outer side from the peripheral rim of the first top face 33A is, where appropriate, termed "overhang region H1" (see FIG. 4).

The second peripheral wall 34 is formed in a ring-shape substantially similar to the external shape of the substrate P, and runs along the first peripheral wall 33 at a predetermined distance thereto. The second top face 34A of the second peripheral wall 34 is arranged such as to be opposite the overhang region H1 of the rear face of the substrate P. The fourth space 44 is formed on the rear face side of the substrate P held by the first holder HD1, and is surrounded by the overhang region H1 of the rear face of the substrate P, the first peripheral wall 33, the second peripheral wall 34, and the base 30.

In this embodiment, the first, second, third, and fourth peripheral walls are substantially concentric. The first holder HD1 holds the substrate P such that the center of the first space 41 substantially matches the center of the rear face of the substrate P.

As shown in FIG. 4, in this embodiment, a first gap G1 of, for example, approximately 2 to 10 μm is provided between the rear face of the substrate P held by the first holder HD1 and the third top face 31A of the third peripheral wall 31. A second gap G2 of, for example, approximately 2 to 10 μm is provided between the rear face of the substrate P held by the first holder HD1 and the fourth top face 32A of the fourth peripheral wall 32. The first peripheral wall 33 contacts the rear face of the substrate P held by the first holder HD1 and the first top face 33A of the first peripheral wall 33. Also, a fourth gap G4 of, for example, approximately 1 to 10 μm is provided between the rear face of the substrate P held by the first holder HD1 and the second top face 34A of the second peripheral wall 34.

The flow port 60 is connected to an outside space (atmospheric space) via a flowpath 60R. The flow port 60 connects to the second space 42. That is, the second space 42 opens to the atmosphere via the flow port 60 and the flowpath 60R connected to the flow port 60. In this embodiment, a plurality of the flow ports 60 are provided at predetermined intervals such as to surround the third peripheral wall 31 on the base 30 between the third peripheral wall 31 and the fourth peripheral wall 32.

The second suction hole 61 is connected via a flowpath 61R to a sucking device including a vacuum system and the like. The second suction hole 61 is also connected to the third space 43. By driving the sucking device connected to the second suction hole 61, the control apparatus 7 can suck fluid from the third space 43 through the second suction hole 61. In this embodiment, a plurality of the second suction holes 61 are provided at predetermined intervals such as to surround the fourth peripheral wall 32 on the base 30 between the fourth peripheral wall 32 and the first peripheral wall 33.

The first suction hole 63 is connected via a flowpath 63R to a sucking device including a vacuum system and the like. The second suction hole 61 is also connected to the fourth space 44. By driving the sucking device connected to the first suction hole 63, the control apparatus 7 can suck fluid from the fourth space 44 through the first suction hole 63. In this embodiment, a plurality of the first suction holes 63 are provided at predetermined intervals such as to surround the first peripheral wall 33 on the base 30 between the first peripheral wall 33 and the second peripheral wall 34.

The first supporting members 81 are pin-like protruding members formed on the top face of the base 30, and are arranged at a plurality of predetermined positions on the top face of the base 30. In this embodiment, a plurality of the first supporting members 81 are arranged on the top face of the base 30 at the inner side (medial side) of the first peripheral wall 33. A plurality of the first supporting members 81 are also arranged on the base 30 in the first space 41 and the third space 43.

A plurality of third suction holes 62 are provided in the base 30 of the first space 41 and the third space 43, and suck fluid (mainly gas) in order to obtain negative pressure in those spaces. In the first space 41, the third suction holes 62 are formed at a plurality of predetermined positions other than in the first supporting members 81. In the third space 43, the third suction holes 62 are provided at positions further away from the fourth peripheral wall 32 than the second suction holes 61.

The third suction hole 62 is connected via a flowpath 62R to a sucking device including a vacuum system and the like. The third suction hole 62 is also connected to the first space 41 and the third space 43. By driving the sucking device connected to the third suction hole 62, the control apparatus 7 can suck fluid from spaces surrounded by the substrate P, the first peripheral wall 33, and the base 30 (specifically, the first space 41 and the third space 43). The control apparatus 7 uses the third suction holes 62 to suck fluid (mainly gas) from the spaces surrounded by the rear face of the substrate P, the first peripheral wall 33, and the base 30, and creates negative pressure in those spaces, whereby the rear face of the substrate P is held by suction to the first supporting members 81. By canceling the suction operation of the third suction holes 62, the control apparatus 7 can release the substrate P from the first holder HD1. Thus in this embodiment, the first holder HD1 removably holds the substrate P. The first holder HD1 includes what is termed a pin-chuck mechanism.

Subsequently, the plate member T and the second holder HD2 that removably holds the plate member T will be explained. The plate member T is a separate member from the table 4T, and is removably fitted to the base 30. A hole TH for disposing the substrate P is substantially circular, and is provided in the center of the plate member T. The plate member T held by the second holder HD2 is disposed such as to surround the substrate P held by the first holder HD1. In this embodiment, the top face of the plate member T held by the second holder HD2 is made flat, such that it is substantially the same height as (or flush with) the top face of the substrate P held by the first holder HD1.

There is a fifth gap G5 of approximately 0.1 to 1.0 mm between the edge (side face) of the outer side of the substrate P held by the first holder HD1 and the edge (inside face) of the inner side of the plate member T held by the second holder HD2. The external shape of the plate member T is rectangular in the XY plane, and in this embodiment is substantially the same as the external shape of the base 30. The plate member T is has liquid repellency, and is made from, for example, a fluorine resin such as polytetrafluoroethylene (Teflon {Registered Trademark}) or a material having liquid repellency such as acrylic resin.

The second holder HD2 includes a fifth peripheral wall 35 that is formed on the base 30, has a fifth top face 35A that is opposite the rear face of the plate member T held by the second holder HD2, and surrounds the second peripheral wall 34, a sixth peripheral wall 36 that is formed on the base 30, has a sixth top face 36A that is opposite the rear face of the plate member T held by the second holder HD2, and surrounds the fifth peripheral wall 35, and a second supporting member 82 that is formed on the base 30 between the fifth peripheral wall 35 and the sixth peripheral wall 36, and supports the rear face of the plate member T.

The fifth top face 35A of the fifth peripheral wall 35 is provided such that it is opposite the inner rim region (inside edge region) of the plate member T near the hole TH. The sixth top face 36A of the sixth peripheral wall 36 is provided such that it is opposite the outer rim region (outside edge region) of the plate member T. A fifth space 45 is provided on the rear face side of the plate member T held by the second holder HD2, and is surrounded by the rear face of the plate member T, the fifth peripheral wall 35, the sixth peripheral wall 36, and the base 30. By creating negative pressure in this fifth space 45, the plate member T is supported on the second supporting members 82 of the second holder HD2.

In this embodiment, the fifth peripheral wall 35 is formed such that the rear face of the plate member T supported by the second supporting member 82 contacts the fifth top face 35A, and the sixth peripheral wall 36 is formed such that the rear face of the plate member T supported by the second supporting member 82 contacts the sixth top face 36A.

The second supporting member 82 is a pin-shaped protruding member formed on the top face of the base 30, a plurality of second supporting members 82 being provided at predetermined positions on the top face of the base 30 between the fifth peripheral wall 35 and the sixth peripheral wall 36.

A fourth suction hole 64 is provided in the top face of the base 30 of the fifth space 45, and sucks fluid (mainly gas) in order to achieve negative pressure in the fifth space 45. The fourth suction hole 64 is for holding the plate member T by suction. In the fifth space 45, the fourth suction holes 64 are provided at a plurality of predetermined positions other than in the second supporting member 82.

The fourth suction hole 64 is connected via a flowpath 64R to a sucking device including a vacuum system and the like. The fourth suction hole 64 is also connected to the fifth space 45. By driving the sucking device connected to the fourth suction hole 64, the control apparatus 7 can suck fluid from the fifth space 45 through the fourth suction hole 64. The control apparatus 7 uses the fourth suction hole 64 to suck fluid (mainly gas) from the fifth space 45 surrounded by the rear face of the plate member T, the fifth peripheral wall 35, the sixth peripheral wall 36, and the base 30, creating negative pressure in the fifth space 45, and thereby holding the plate member T on the second supporting members 82 by suction. By canceling the suction operation of the fourth suction holes 64, the control apparatus 7 can release the plate member T from the second holder HD2. Thus in this embodiment, the second holder HD2 removably holds the plate member T. The second holder HD2 includes what is termed a pin-chuck mechanism.

A sixth space 46 is surrounded by the overhang region H1 of the rear face of the substrate P and the second peripheral wall 34, the fifth peripheral wall 35, and the base 30, and is connected via an outside space (atmospheric space) to the fifth gap G5 formed between the substrate P and the plate member T.

The fourth space 44 is connected to the outside space via the fourth gap G4 and the fifth gap G5. That is, the fourth and fifth gaps G4 and G5 enable fluid to flow between the fourth space 44 and the outside space.

A sixth gap G6 of approximately 1 mm is provided between the outer side face of the first peripheral wall 33 and the inner side face of the second peripheral wall 34, and a seventh gap G7 of approximately 1 mm is provided between the outer side face of the second peripheral wall 34 and the inner side face of the fifth peripheral wall 35.

Subsequently, an operation of the table 4T having the configuration described above and a main operation of the overall exposure apparatus EX will be explained.

The control apparatus 7 uses the conveying device 100 to load a substrate P for exposure processing onto the first holder HD1 of the table 4T at a substrate replacement position (loading position). By using the third suction hole 62 to achieve negative pressure in the space surrounded by the first peripheral wall 33, the control apparatus 7 makes the first supporting members 81 hold the substrate P by suction. Before the substrate P is held by the first holder HD1, the plate member T is held by the second holder HD2.

In this embodiment, after loading the substrate P onto the first holder HD1, the control apparatus 7 starts a suction operation of the second suction hole 61. Furthermore in this embodiment, the control apparatus 7 does not execute a suction operation using the first suction hole 63 during immersion exposure of the substrate P.

To perform immersion exposure of the substrate P held by the first holder HD1, the control apparatus 7 uses the nozzle member 70 to form the immersion space LR between the nozzle member 70 and the substrate P. The control apparatus 7 then exposes the substrate P held by the first holder HD1 of the table 4T via the liquid LQ in the immersion space LR.

For example, when immersion-exposing a peripheral region of the top face of the substrate P, part of the immersion space LR is formed between the plate member T on the outer side of the substrate P and the nozzle member 70. That is, the immersion space LR of the liquid LQ is formed over the fifth gap G5. In this embodiment, since the fifth gap G5 is small, the surface tension of the liquid LQ prevents the liquid LQ from infiltrating the fifth gap G5. The liquid repellency of the plate member T also prevent the liquid LQ from infiltrating the fifth gap G5.

Even if the liquid LQ infiltrates the fifth gap G5 due to a change in pressure and the like of the liquid LQ in the immersion space LR, and liquid LQ that infiltrates the sixth space 46 via the fifth gap G5 then infiltrates the fourth space 44 via the fourth gap G4, since the rear face of the substrate P is contacting (is coherent with) the first top face 33A of the first peripheral wall 33, infiltration of the liquid LQ to the inner side of the first peripheral wall 33 is prevented.

Figure 5:
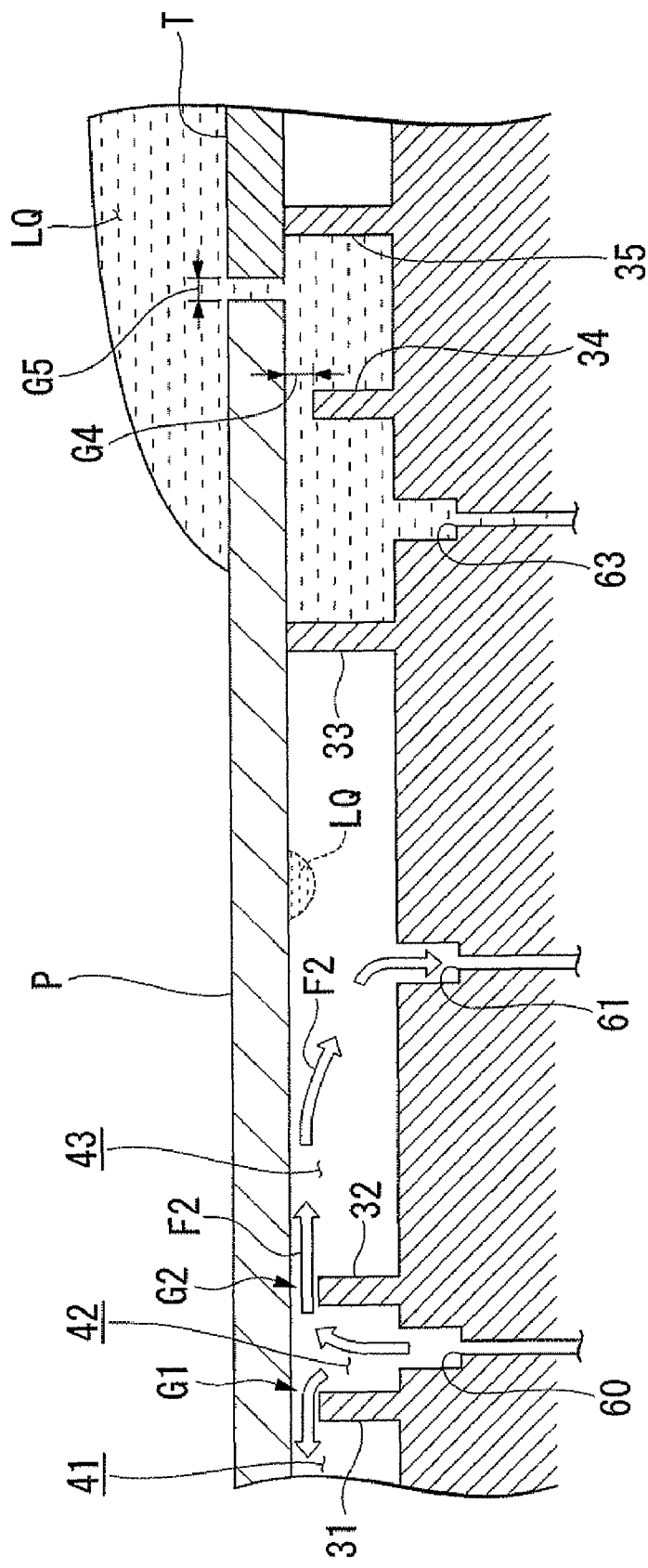
FIG. 5 is an explanatory schematic view of an operation of a table according to the first embodiment.

In this embodiment, when at least the immersion space LR is formed, the suction operation of the second suction hole 61 is being executed, and, as shown schematically in FIG. 5, a flow of gas F2 is created from the second space 42 via the second gap G2 toward the third space 43. Therefore, even if, for some reason, a gap is formed between the rear face of the substrate P and the first top face 33A of the first peripheral wall 33, and liquid LQ infiltrates between the rear face of the substrate P and the first top face 33A of the first peripheral wall 33, and to the inner side of the first peripheral wall 33, the flow of gas F2 prevents the liquid LQ from infiltrating any further to the inner side than the fourth peripheral wall 32.

The size of the second gap G2 is optimized, and the third space 43 is kept at a desired pressure (negative pressure state). Therefore, the suction holding operation of the substrate P performed by the first holder HD1 is not obstructed. Similarly, the size of the first gap G1 is optimized, and the suction holding operation of the substrate P performed by the first holder HD1 is not obstructed.

Figure 6:
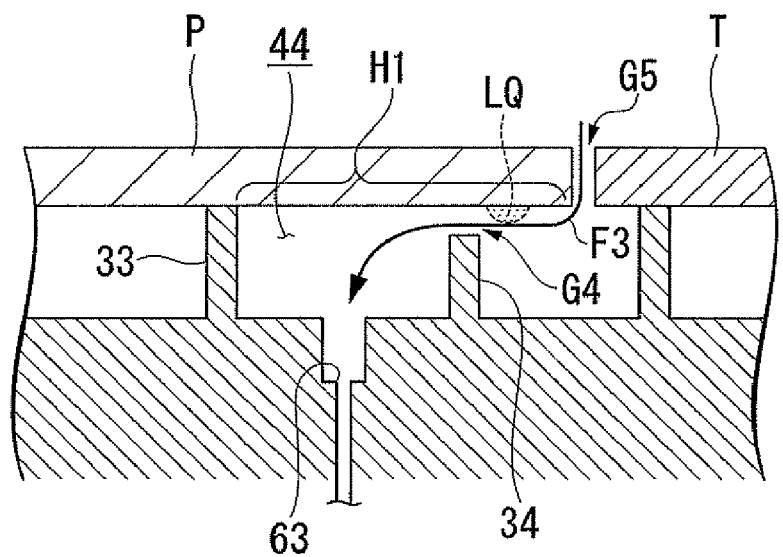
FIG. 6 is an explanatory schematic view of an operation of a table according to the first embodiment.

After the immersion exposure of the substrate P ends and the immersion space LR on the substrate P and the plate member T is removed, the control apparatus 7 starts a suction operation using the first suction hole 63 while the first holder HD1 is still holding the substrate P. As shown schematically in FIG. 6, this suction operation of the first suction hole 63 creates a flow of gas F3 from the outside space, across the fifth gap G5, toward the first suction hole 63. The first suction hole 63 thereby collects liquid LQ stuck in the overhang region H1 of the rear face of the substrate P, liquid LQ in the fourth space 44, etc.

After stopping all suction operations by the first suction hole 63, the second suction hole 61, and the third suction hole 62, the control apparatus 7 uses a substrate-lifting mechanism such as a lift-pin (not shown) to lift the substrate P with respect to the first holder HD1, and, at the substrate replacement position, unloads the substrate P from the first holder HD1 using the conveying device 100.

As described above, there is a possibility that a part of the table 4T, such as the first peripheral wall 33 and the second peripheral wall 34, or the fifth peripheral wall 35, will contact the liquid LQ that has infiltrated the fifth gap G5, and that the part of the table 4T that contacts the liquid LQ will be polluted or contaminated by it. When part of the substance of the substrate P (e.g. part of the photosensitive material, or a topcoat film covering the photosensitive material, or both) is eluted by contact with the liquid LQ, or peels away and becomes mixed with it, there is a possibility that liquid LQ containing that substance will infiltrate the fifth gap G5. In that case, since the liquid LQ containing the substance contacts the first peripheral wall 33, the second peripheral wall 34, and so on, they will be polluted or contaminated by the substance (e.g. part of the photosensitive material) contained in the liquid LQ. Substances that pollute or contaminate the first peripheral wall 33, the second peripheral wall 34, and so on are not limited to those in the liquid LQ, and also include, for example, substances (foreign bodies) floating in the space where the exposure apparatus EX is provided.

In the following explanation, a substance that pollutes or contaminates part of the table 4T such as the first peripheral wall 33 and the second peripheral wall 34, or the fifth peripheral wall 35, is termed, where appropriate, 'polluting substance'.

When at least part of the table 4T holding the substrate P (e.g. the first peripheral wall 33 and the second peripheral wall 34) is left in a polluted or contaminated state, there is a possibility that the table 4T will become unable to properly hold the substrate P, and that the substrate P held by the table 4T will itself become polluted or contaminated, leading to increased pollution or contamination. For example, if the polluting substance is left in a state of being stuck to the first top face 33A of the first peripheral wall 33, there is a possibility that the rear face of the substrate P will not properly contact (be coherent with) the first top face 33A of the first peripheral wall 33, and that the table 4T will become unable to properly hold the substrate P. If there is poor contact (coherence) between the rear face of the substrate P and the first top face 33A of the first peripheral wall 33, there is also a possibility that a large amount of the liquid LQ will infiltrate to the inner side of the first peripheral wall 33, and that the liquid LQ will stick to the rear face of the substrate P. When a large amount of the liquid LQ infiltrates to the inner side of the first peripheral wall 33, there is a possibility that this will affect the substrate-holding operation of the table 4T. Furthermore, when the liquid LQ sticks to the rear face of the substrate P, there is a possibility that the conveying device 100 that unloads the substrate P from the table 4T will become wet and/or contaminated. If the polluting substance is left sticking to the top face of the table 4T between the first peripheral wall 33 and the second peripheral wall 34, or the top face of the table 4T between the second peripheral wall 34 and the fifth peripheral wall 35, there is a possibility that the polluting substance will pass across the fifth gap G5 and infiltrate the immersion space LR formed on at least one of the top side of the substrate P and the top side of the plate member T, whereby the exposure precision may be affected and the top faces of the substrate P and the plate member T may become polluted or contaminated.

Accordingly in this embodiment, the table 4T is cleaned using a cleaning member CP. A cleaning method according to this embodiment will be explained.

Figure 7:
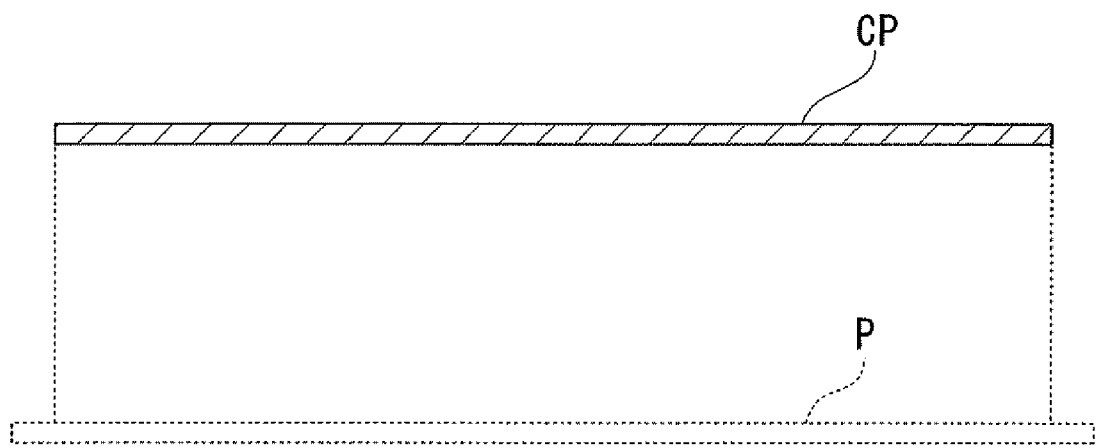
FIG. 7 is a view of a cleaning member according to the first embodiment.

FIG. 7 is a schematic view of a cleaning member CP according to this embodiment. The cleaning member CP is used in cleaning at least part of the table 4T that holds the rear face of the substrate P where the exposure light EL is irradiated, and is held by the first holder HD1 of the table 4T.

In this embodiment, the cleaning member CP is a plate-like member having substantially the same external shape as the substrate P while being smaller than it. As already mentioned, the external shape of the substrate P is circular in the XY plane, and so is the external shape of the cleaning member CP. That is, the shape of the cleaning member CP in the XY plane resembles that of the substrate P. In this embodiment, the cleaning member CP is a disk-like member having substantially the same thickness as the substrate P.

As described above, the first peripheral wall 33 has substantially the same external shape as the substrate P. Therefore, the cleaning member CP has substantially the same external shape as the first peripheral wall 33, similar to the substrate P.

In the explanation below, the cleaning member CP is abbreviated as 'substrate CP' where appropriate.

The top face and rear face of the substrate CP have liquid repellency. In this embodiment, the substrate CP is made from a fluorine resin such as polytetrafluoroethylene (Teflon {Registered Trademark}) or a material having liquid repellency such as acrylic resin. The substrate CP can be made from metal, or from the same material as the base (semiconductor wafer) of the substrate P, its top face and rear face each being covered with a wetting material such as fluorine resin.

Figure 8:
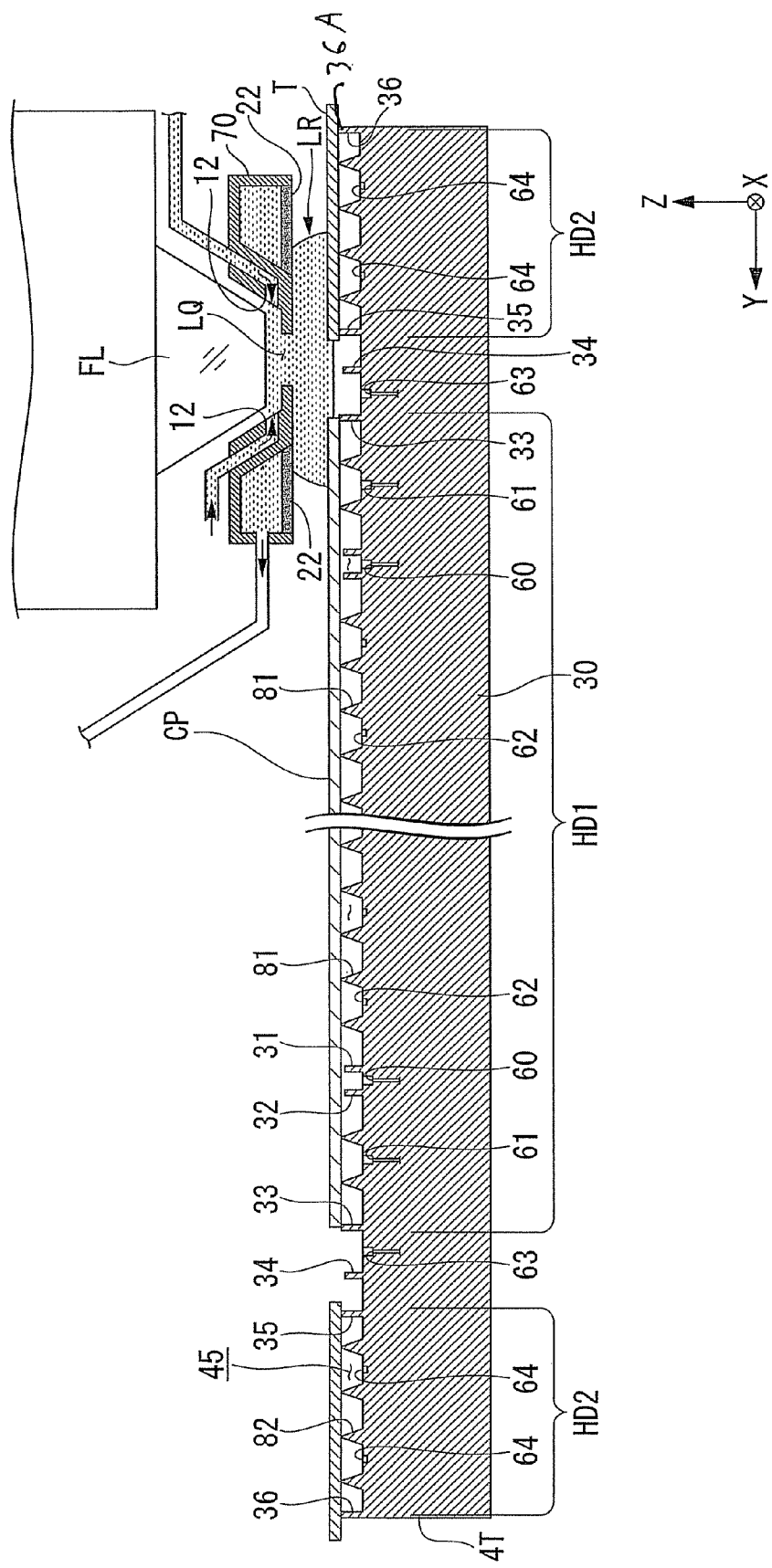
FIG. 8 is an explanatory schematic view of a cleaning method according to the first embodiment.
Figure 9:
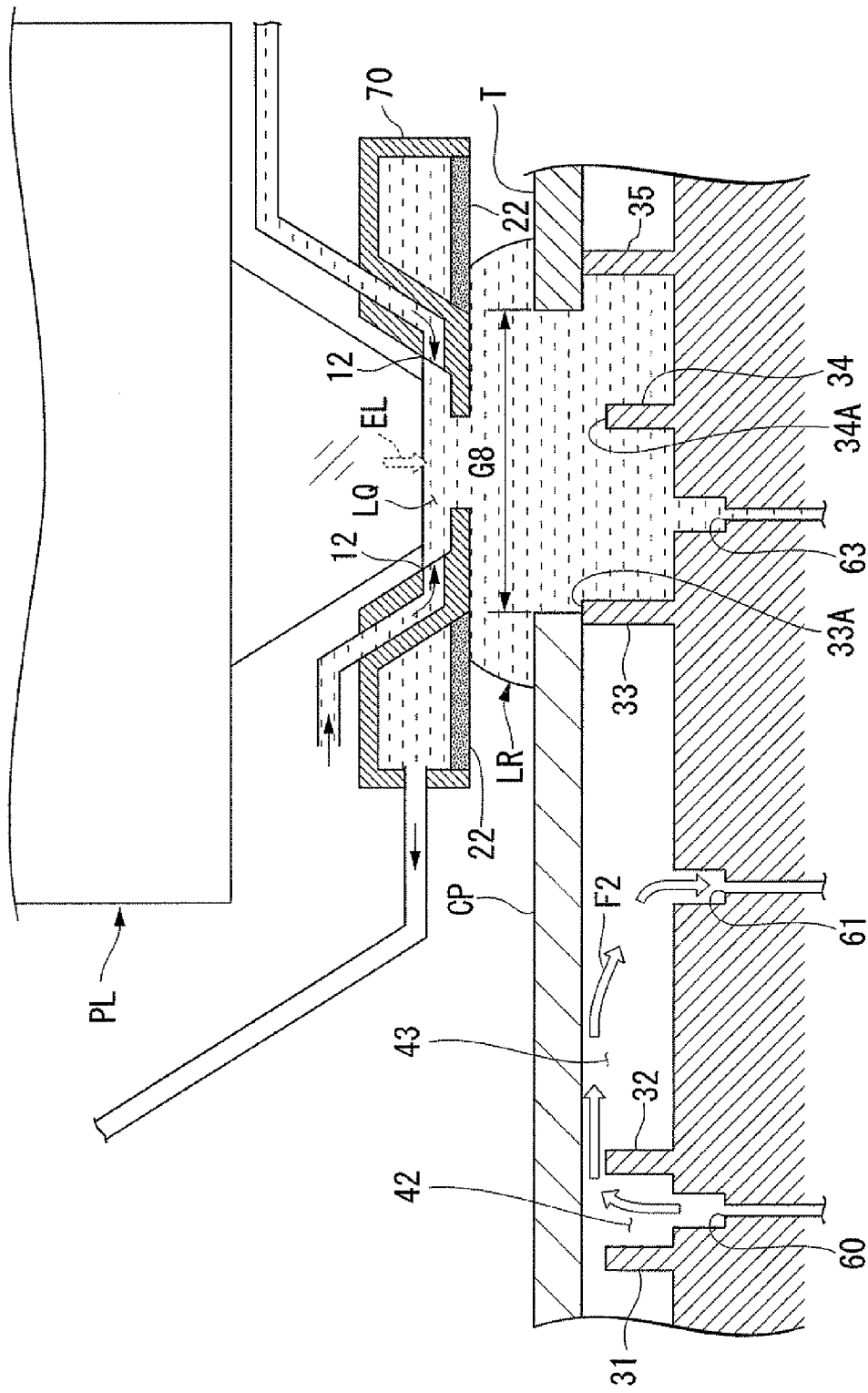
FIG. 9 is an enlarged view of part of FIG. 8.

FIG. 8 is a schematic view of a state where the substrate CP is used to clean the table 4T. FIG. 9 is an enlargement of FIG. 8. When cleaning the table 4T, the control apparatus 7 uses the conveying device 100 to load the substrate CP onto the first holder HD1 of the table 4T. Since the substrate CP is a plate-like member having substantially the same thickness and substantially the same external shape as the substrate P, the conveying device 100 can smoothly convey the substrate CP. The conveying device that conveys the substrate P can be another device (member) separate from the conveying device that conveys the substrate CP.

The control apparatus 7 controls the table 4T and makes it hold the substrate CP on the table 4T, that was loaded onto the table 4T by the conveying device 100. In this embodiment, the substrate CP has an outer diameter that is smaller than the diameter of the outer rim of the first top face 33A of the first peripheral wall 33, and is held by the table 4T such as to expose at least part of the first top face 33A of the first peripheral wall 33 that is fitted to the table 4T such that it is opposite the peripheral region of the rear face of the substrate P.

Since the substrate CP has an outer diameter that is smaller than the diameter of the outer rim of the first top face 33A of the first peripheral wall 33, and has substantially the same external shape as the first peripheral wall 33, by holding the substrate CP on the table 4T such that the center of the space surrounded by the first peripheral wall 33 matches the center of the rear face of the substrate CP, the substrate CP can be held by the table 4T such as to expose at least part of the first top face 33A of the first peripheral wall 33.

In this embodiment, the substrate CP has an outer diameter that is smaller than the diameter of the outer rim of the first top face 33A of the first peripheral wall 33, and larger than the diameter of the inner rim of the first top face 33A of the first peripheral wall 33. Therefore, part of the rear face of the substrate CP can contact part of the first top face 33A of the first peripheral wall 33.

When the first holder HD1 holds the substrate CP, an eighth gap G8 is formed between the outside edge (side face) of the substrate CP held by the first holder HD1 and the inside edge (inner side face) of the plate member T held by the second holder HD2, this eighth gap G8 being larger than the fifth gap G5 formed between the outside edge of the substrate P held by the first holder HD1 and the inside edge of the plate member T.

A cleaning operation of the table 4T is performed using liquid. With the substrate CP in a state of being held by the first holder HD1, the control apparatus 7 supplies a liquid for cleaning to at least part of the table 4T. The liquid is supplied at least to the eighth gap G8.

In this embodiment, the liquid LQ (water) for exposure is used as the liquid for cleaning. To execute a cleaning operation of the table 4T, the control apparatus 7 moves the table 4T holding the substrate CP such that at least part of the table 4T is opposite the nozzle member 70, and forms the immersion space LR of the liquid LQ between the substrate CP and the table 4T (plate member T) and the nozzle member 70.

In this embodiment, the control apparatus 7 performs at least parts of the liquid supply operation from the liquid supply port 12 and the liquid collection operation from the liquid collection port 22 in parallel, whereby the immersion space LR of the liquid LQ is formed between the substrate CP and the table 4T (plate member T) and the nozzle member 70.

As shown in FIGS. 8 and 9, the control apparatus 7 controls the relative position of the table 4T with respect to the nozzle member 70 such that at least part of the immersion space LR is formed above the eighth gap G8. As described above, since the substrate CP is smaller than the substrate P, some of the liquid LQ easily infiltrates from the eighth gap G8 between the edge of the substrate CP and the plate member T, and contacts a region of part of the table 4T. The region that contacts the liquid LQ includes the top face of the table 4T (base 30) between the first peripheral wall 33 and the second peripheral wall 34, and at least part of the first top face 33A of the first peripheral wall 33. The region that contacts the liquid LQ also includes the top face of the table 4T between the second peripheral wall 34 and the fifth peripheral wall 35, and at least part of the second top face 34A of the second peripheral wall 34.

By contacting the liquid LQ, the region of part of the table 4T that the liquid LQ contacts is cleaned by that liquid LQ. That is, a polluting substance that sticks or is adhered to a region of part of the table 4T, such as the first peripheral wall 33 and the second peripheral wall 34, is stripped away (removed) from the surface of the table 4T by the liquid LQ in the immersion space LR. In this embodiment, the liquid supply operation from the liquid supply port 12 and the liquid collection operation from the liquid collection port 22 are performed in parallel, whereby clean liquid LQ from the liquid supply port 12 can be continuously supplied to a region of part of the table 4T where there is a possibility that a polluting substance will stick, and the clean liquid LQ that is supplied can properly remove the polluting substance. The removed polluting substance is immediately collected into the liquid collection port 22.

While using the nozzle member 70 to form the immersion space LR, the control apparatus 7 uses the first suction hole 63 to suck at least some of the liquid LQ. That is, in this embodiment, the control apparatus 7 performs the operation of supplying liquid from the liquid supply port 12 in parallel with the operation of collecting liquid using the liquid collection port 22, and with the operation of collecting liquid using the first suction hole 63 (suction operation). Since the liquid collection port 22 of the nozzle member 70 is arranged at a position opposite the surface of the table 4T above the table 4T, there is a possibility that, for example, a polluting substance that is removed from the surface of the table 4T and floats in the liquid LQ will not be able to smoothly reach the liquid collection port 22 due to the effect of gravity. By executing the operation of collecting liquid using the first suction hole 63 disposed on one part of the table 4T (the top face of the base 30), the control apparatus 7 can collect the polluting substance that could not be collected by the liquid collection port 22.

During the cleaning operation using the liquid LQ, the control apparatus 7 executes a suction operation using the second suction hole 61. By executing this suction operation using the second suction hole 61, since a flow of gas F2 is created from the second space 42 via the second gap G2 toward the third space 43 as described above, even if the liquid LQ infiltrates between the rear face of the substrate CP and the first top face 33A of the first peripheral wall 33 to the inner side of the first peripheral wall 33, this infiltrated liquid LQ can be collected by the second suction hole 61, and, in addition, the flow of gas F2 that is created can prevent the liquid LQ from infiltrating any further to the inner side than the fourth peripheral wall 32.

Where necessary, the control apparatus 7 irradiates the exposure light EL having photochemical cleaning function to the table 4T while using the liquid LQ to perform the cleaning operation of the table 4T. That is, while using the nozzle member 70 to form the immersion space LR over the eighth gap G8, the control apparatus 7 uses the projection optical system PL to irradiates the exposure light EL onto part of the table 4T such as the first peripheral wall 33 and the second peripheral wall 34, or the fifth peripheral wall 35, etc. Since this embodiment uses ArF excimer laser light, which is infrared light having photochemical cleaning function, as the exposure light EL, the region of the table 4T that is irradiated with the exposure light EL is photochemically cleaned. By irradiation of the infrared exposure light EL, a polluting substance (organic substance) sticking to the surface of the table 4T is removed by oxidative degradation. Incidentally, light having photochemical cleaning function can be irradiated onto the table 4T from another light-generating device separate to the illumination system IL (light source for exposure light).

In this embodiment, the control apparatus 7 performs the operation of supplying liquid from the liquid supply port 12 in parallel with at least part of the operation of collecting liquid in the liquid collection port 22, while relatively moving the nozzle member 70 and the table 4T holding the substrate P.

Figure 10:
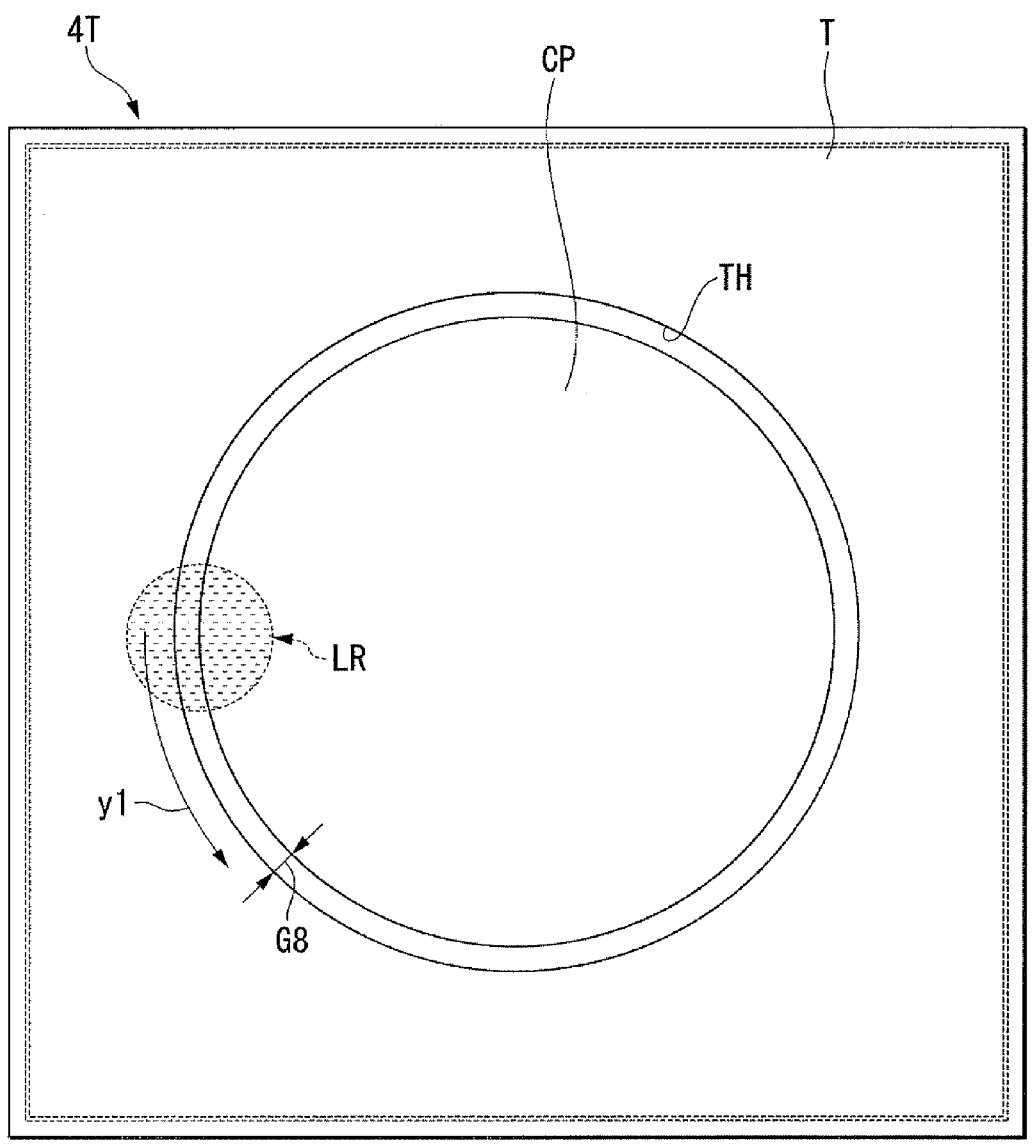
FIG. 10 is an explanatory schematic view of a cleaning method according to the first embodiment.

For example, as indicated by arrow y1 in FIG. 10, the control apparatus 7 performs the operation of supplying liquid from the liquid supply port 12 in parallel with at least part of the operation of collecting liquid in the liquid collection port 22, while moving the table 4T holding the substrate CP with respect to the nozzle member 70 such that the immersion space LR moves along the ring-shaped eighth gap G8 (the edge of the substrate CP). This enables a wide area of the table 4T to be cleaned.

Figure 11:
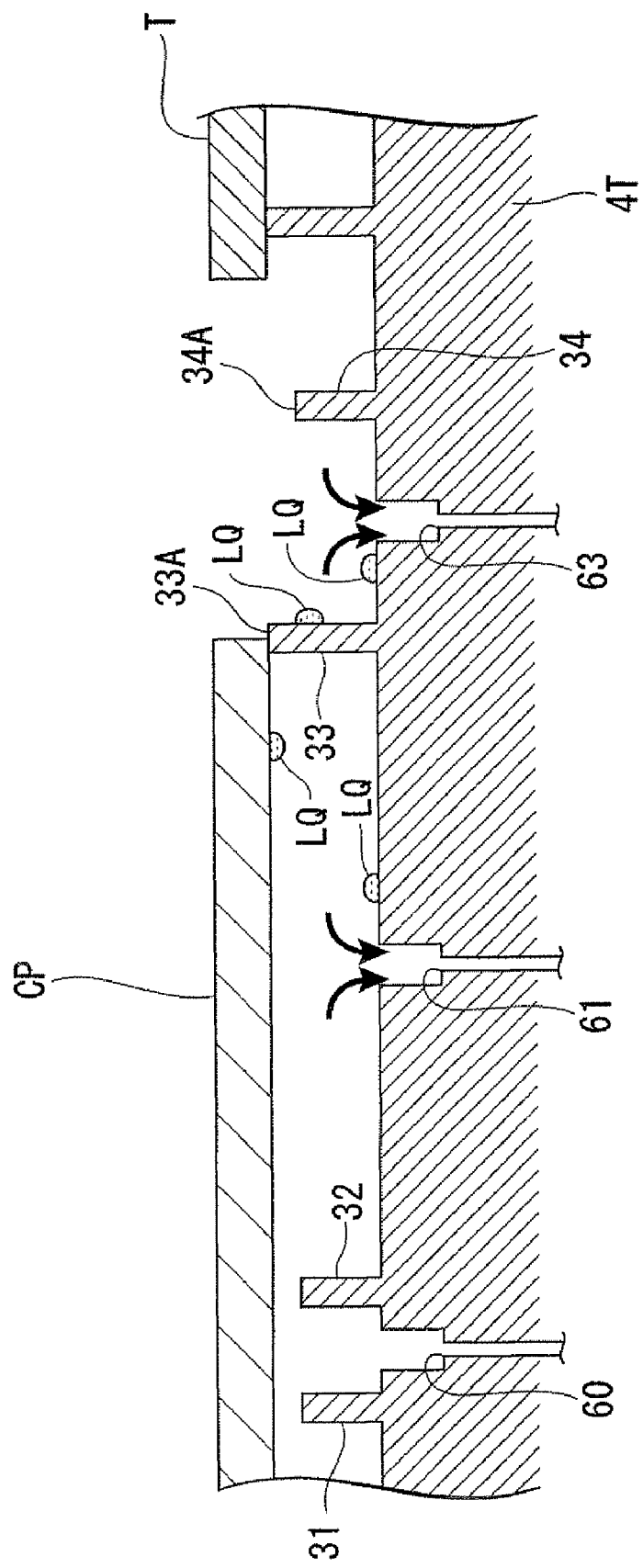
FIG. 11 is an explanatory schematic view of a cleaning method according to the first embodiment.

After the cleaning operation using the substrate CP ends, the control apparatus 7 stops operation of supplying liquid from the liquid supply port 12 of the nozzle member 70, and in addition, executes the suction operation from the liquid collection port 22, the first suction hole 63, and the second suction hole 61, whereby, as shown schematically in FIG. 11, the immersion space LR is eliminated from the substrate CP and the table 4T (plate member T). The control apparatus 7 stops the operation of collecting liquid from the liquid collection port 22, continues the suction operation of the first suction hole 63 and the second suction hole 61 for a predetermined time. By executing the suction operation of the first suction hole 63, liquid LQ remaining on the surface and the like of the table 4T between the first peripheral wall 33 and the second peripheral wall 34 can be collected into the first suction hole 63, and the liquid LQ can be prevented from remaining on the surface of the table 4T between the first peripheral wall 33 and the second peripheral wall 34. By executing the suction operation of the second suction hole 61, even if the liquid LQ infiltrates to the inner side of the first peripheral wall 33, this infiltrated liquid LQ can be collected by the second suction hole 61.

After stopping all suction operations of the first suction hole 63, the second suction hole 61, and the third suction hole 62, the control apparatus 7 uses a substrate-lifting mechanism such as a lift-pin (not shown) to lift the substrate CP with respect to the first holder HD1, and uses the conveying device 100 (or another conveying device) to unload the substrate CP from the first holder HD1 at the substrate replacement position.

The cleaned table 4T then holds a new substrate P. The exposure light EL irradiates onto the substrate P held on the table 4T to expose the substrate P.

As described above, by using the substrate CP, the table 4T can be cleaned smoothly and properly. This can suppress deterioration in exposure precision caused by a polluting substance sticking to the table 4T, and enable the substrate P to be properly irradiated with exposure light EL.

In this embodiment, since the first top face 33A of the first peripheral wall 33 can be cleaned intensively by arranging the substrate CP such that the first top face 33A of the first peripheral wall 33 is opened, the table 4T including the first peripheral wall 33 can properly hold the substrate P and enable it to be irradiated with the exposure light EL.

Furthermore, since this embodiment makes it possible to intensively clean the first peripheral wall 33 and the second peripheral wall 34, or the fifth peripheral wall 35 and the like that form spaces (the fourth space 44 and the sixth space 46) which can be connected to an outside space via the eighth gap G8, polluting substances sticking to the first peripheral wall 33 and the second peripheral wall 34, or the fifth peripheral wall 35, and the like, can be prevented from being released into the outside space and into the immersion space LR.

In this embodiment, instead of cleaning all regions of the table 4T (the first holder HD1), local regions are cleaned intensively, thereby preventing the cleaning operation from taking a long time and becoming complex, and enabling the cleaning operation to be executed smoothly, properly, and within a short time.

In this embodiment, since the top face and rear face of the substrate CP that contacts the liquid LQ have liquid repellency, the liquid LQ can be prevented from infiltrating between the rear face of the substrate CP and the first peripheral wall 33 to the inner side of the first peripheral wall 33. Also, after the cleaning operation using the liquid LQ ends, the liquid LQ contacting the substrate CP can be smoothly collected, and the liquid LQ can be prevented from remaining on the top face, the rear face, and the like of the substrate CP.

Second Embodiment

Subsequently, a second embodiment will be explained. In this embodiment, constituent parts which are the same or similar to those of the embodiment described above are represented by same reference codes and are not repetitiously explained.

Figure 12A:
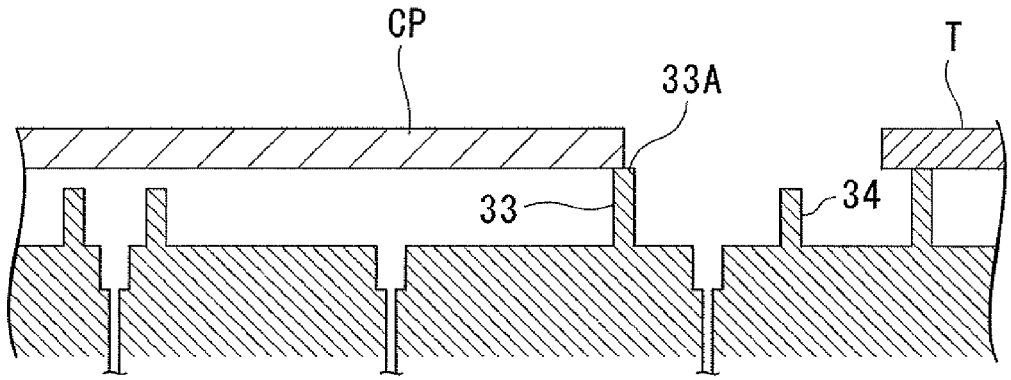
FIG. 12A is a view of a cleaning member according to a second embodiment.
Figure 12B:
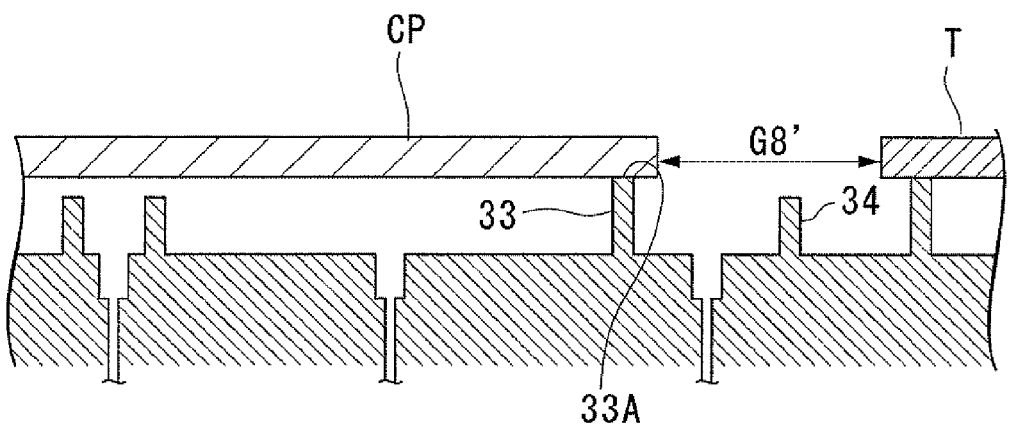
FIG. 12B is a view of a cleaning member according to the second embodiment.

While in the first embodiment, as shown schematically in FIG. 12A, the substrate CP has an outer diameter that is smaller than the diameter of the outer rim of the first top face 33A of the first peripheral wall 33 and larger than the diameter of the inner rim of the first top face 33A of the first peripheral wall 33, as shown in FIG. 12B, it can have an outer diameter that is larger than the outer rim of the first top face 33A of the first peripheral wall 33. In this case, although the first top face 33A of the first peripheral wall 33 is not opened, since an eighth gap G8' between the substrate CP and the plate member T is larger than the fifth gap G5 between the substrate P and the plate member T, the liquid LQ for cleaning can be supplied into a space between the first peripheral wall 33 and the second peripheral wall 34, and part of the table 4T can be cleaned by using the liquid LQ supplied into that space.

Figure 12C:
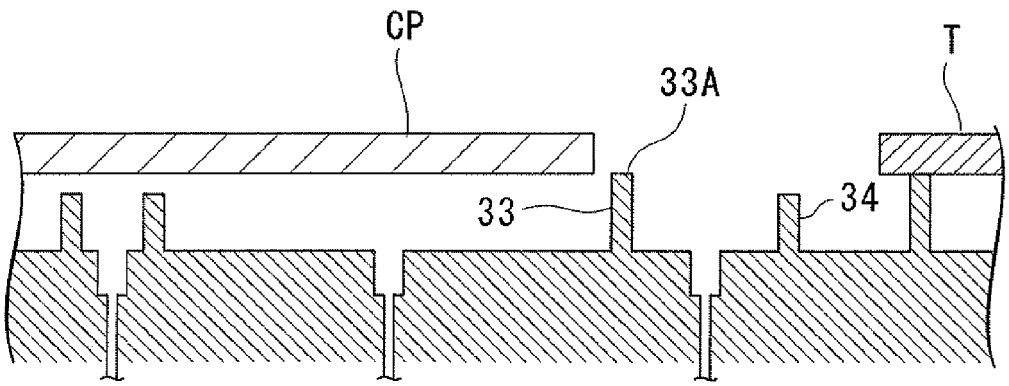
FIG. 12C is a view of a cleaning member according to the second embodiment.
Figure 13:
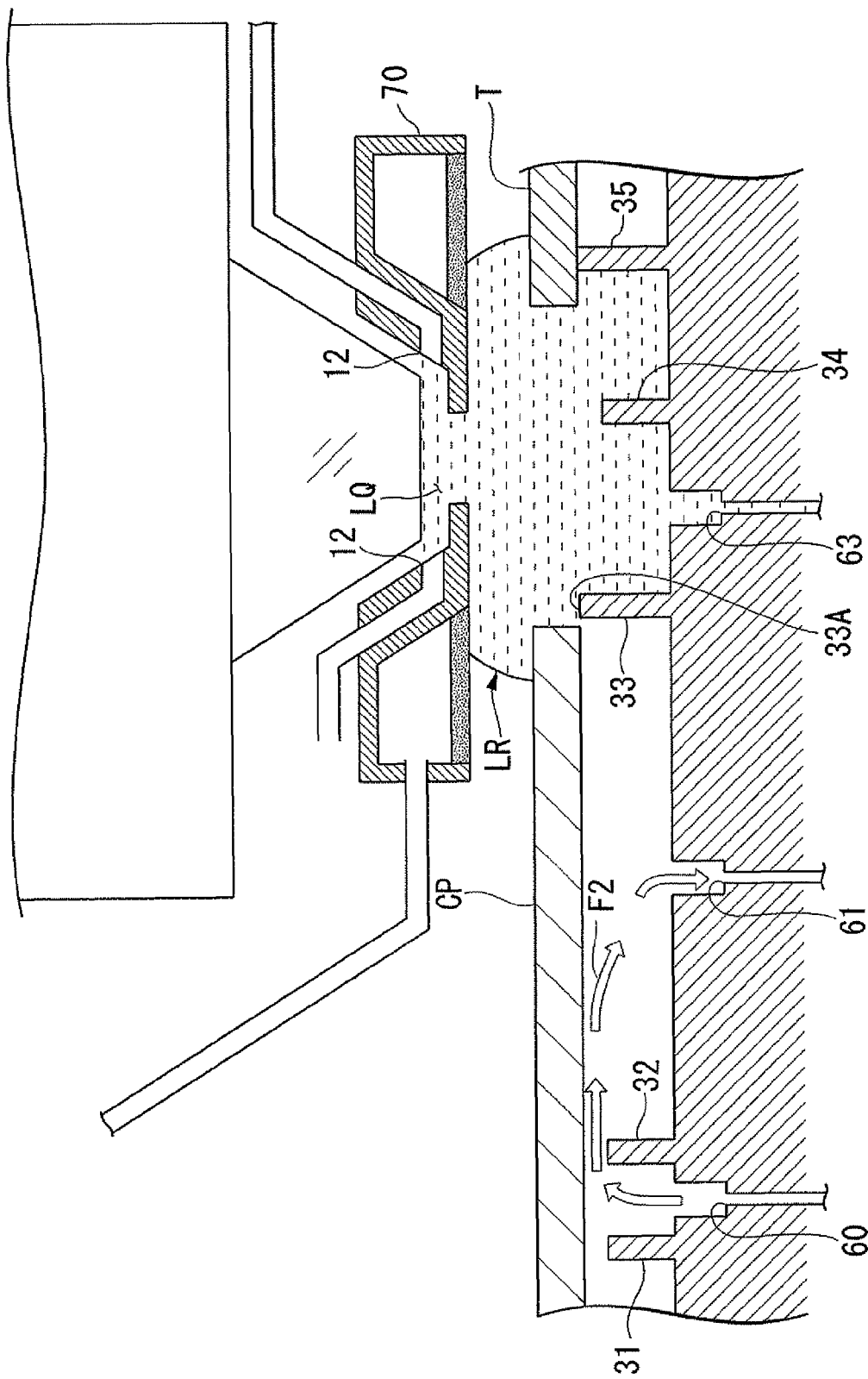
FIG. 13 is an explanatory schematic view of a cleaning method according to the second embodiment.

As shown in FIG. 12C, the substrate CP can have an outer diameter that is smaller than the diameter of the inner rim of the first top face 33A of the first peripheral wall 33. In this case, as shown in FIG. 13, since the liquid LQ for cleaning can be made to contact almost all regions of the first top face 33A of the first peripheral wall 33, the first top face 33A of the first peripheral wall 33 can be cleaned properly.

In other words, the outer diameter of the substrate CP can be determined in accordance with the region (space) of the table 4T that is to be cleaned, and it is possible to use, for example, a substrate whose outer diameter is 2.0 mm to 20.0 mm smaller than the stipulated outer diameter of the substrate P (in the case of a circular substrate, a circular substrate whose radius is 1.0 to 10.0 mm smaller than the stipulated radius).

Third Embodiment

Figure 14:
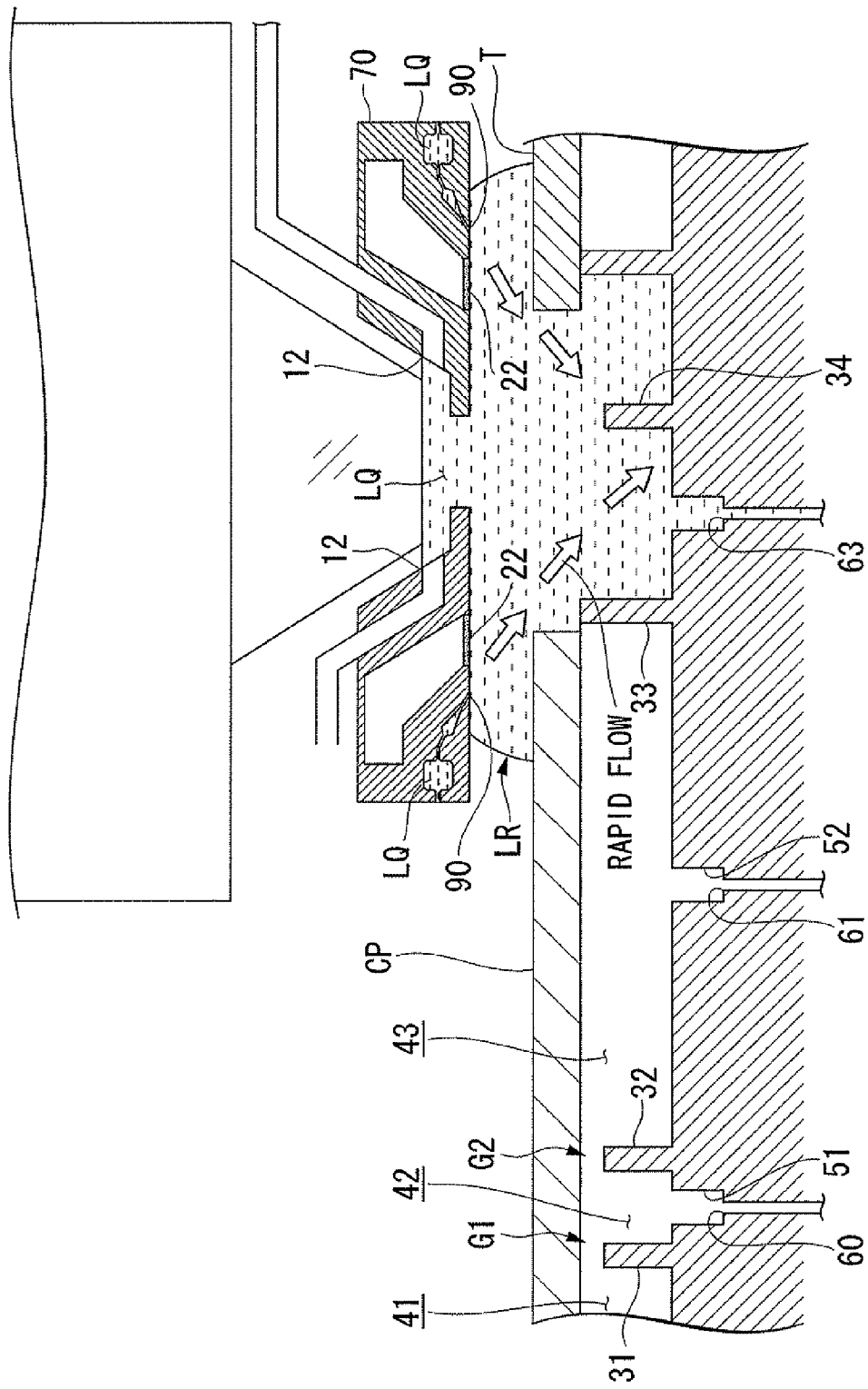
FIG. 14 is an explanatory schematic view of a cleaning method according to a third embodiment.

Subsequently, a third embodiment will be explained. FIG. 14 is a view of the vicinity of a nozzle member 70 according to a third embodiment. In this embodiment, the nozzle member 70 includes a liquid ejection hole 90 capable of ejecting liquid LQ in the immersion space LR, the liquid LQ being ejected from the liquid spray hole 90 in the immersion space LR, thereby forming a rapid flow of liquid LQ in the immersion space LR. The rapid flow of liquid LQ acts upon the surface of the table 4T. This assists the removal of polluting substances that stick to the surface of the table 4T.

In the first to third embodiments, the cleaning operation using the substrate CP can, for example, be executed each time a predetermined number of substrates P are processed, for each lot, at predetermined time intervals, etc.

As described above, the exposure apparatus EX includes the detecting device 26 that can detect the quality (water quality) of the liquid LQ for exposure collected from the liquid collection port 22. Since this detecting device 26 can detect the pollution or contamination state of the liquid LQ for exposure collected by the liquid collection port 22, the control apparatus 7 can execute the cleaning operation using the substrate CP when the control apparatus 7 determines, based on the detection result of the detecting device 26, that the liquid LQ for exposure collected by the liquid collection port 22 is polluted or contaminated. Since the pollution or contamination state of the liquid LQ collected by the liquid collection port 22 changes in accordance with the pollution or contamination state of the table 4T, the control apparatus 7 can use the detecting device 26 to detect the polluted or contaminated state of the liquid LQ collected by the liquid collection port 22, and determine (estimate) the polluted or contaminated state of the table 4T based on that detection result. When, based on the detection result of the detecting device 26, the control apparatus 7 determines that the pollution or contamination state of the table 4T is not within a permissible range, it executes the cleaning operation without starting the next exposure operation.

After exposing an image of a pattern onto the substrate P, a predetermined measuring device can be used to measure the shape of the pattern formed on the substrate P, and the cleaning operation using the substrate CP can then be executed in accordance with the measurement. For example, when the control apparatus 7 determines, based on the measurement of the pattern shape, that a defect of the pattern is not within a permissible range, the control apparatus 7 determines that the polluted or contaminated state of the table 4T is not within a permissible range, and executes the cleaning operation. Alternatively, the first holder HD1 can be made to hold a dummy substrate whose surface has a high degree of flatness, and the shape (flatness) of the surface of the dummy substrate is detected with an oblique incidence type focus/leveling detection system, or such like; when it is determined that the flatness deficiency is not within a permissible range, the control apparatus 7 determines that the pollution or contamination state of the table 4T is not within the permissible range, and executes the cleaning operation.

While in the embodiments described above, to clean the table 4T, the control apparatus 7 performs the operations of supplying liquid from the liquid supply port 12, collecting liquid in the liquid collection port 22, and collecting liquid in the first suction hole 63 (suction operation) in parallel, the suction operation of the first suction hole 63 can be stopped during the cleaning operation. By not executing the suction operation of the first suction hole 63 during the cleaning operation, and executing the suction operation using the first suction hole 63 after the cleaning operation ends, the liquid LQ can be prevented from remaining on the surface of the table 4T between the first peripheral wall 33 and the second peripheral wall 34. Alternatively, the operation of collecting liquid in the liquid collection port 22 can be stopped during the cleaning operation.

While in the embodiments described above, the control apparatus 7 executes the suction operation using the second suction hole 61 during the cleaning operation of the table 4T, the suction operation using the second suction hole 61 can be stopped during the cleaning operation. By not executing the suction operation using the second suction hole 61 during the cleaning operation, and executing the suction operation using the second suction hole 61 after the cleaning operation ends, liquid LQ that has infiltrated to the inner side of the first peripheral wall 33 can be collected in the second suction hole 61.

While the embodiments described above use the liquid LQ for exposure as the liquid for cleaning, a different liquid other than the liquid LQ can be used instead. For example, an alcohol-type liquid such as ethanol and methanol, or a liquid containing a surfactant, can be used as the liquid for cleaning. Also, so-called functional water that is formed by dissolving a predetermined gas in water, such as ozone water made by dissolving ozone gas in water and hydrogen water made by dissolving hydrogen in water, can be used as the liquid for cleaning.

A vibrating device can also be used to apply vibrations (e.g. ultrasound waves) to the cleaning liquid.

While in each of the embodiments described above, the table 4T is cleaned using the nozzle member 70 that forms the immersion region LR when exposing the substrate P, a special nozzle member for cleaning can be provided; a cleaning operation of the table 4T can then be executed by holding the liquid for cleaning between the substrate CP and the plate member T, and the nozzle member.

While in each of the embodiments described above, the removable plate member T forms a flat section around the substrate P, the flat section around the substrate P can be formed by a member formed in a single piece with the base 30. That is, the configuration of the table 4T is not limited to that described above, it being possible to use various configurations for the table 4T, provided that the substrate P to be exposed by immersion can be held properly.

While in each of the embodiments described above, the member CP is a plate-like member having substantially the same external shape as the substrate P and substantially the same thickness as the substrate P, the member CP need not be plate-like, and its external shape and thickness can be different from that of the substrate P, provided only that, when held by the table 4T (first holder HD1), a region desired to be cleaned, such as at least part of the first top face 33A of the first peripheral wall 33, can be opened and made to contact the cleaning liquid. Furthermore, while in each of the embodiments described above, the top face and rear face of the member CP have liquid repellency with respect to the cleaning liquid, regions with liquid repellency can be formed on parts of the member CP where necessary, and, provided that the table 4T can be cleaned and the cleaning liquid can be collected smoothly, regions with liquid repellency need not be formed on the member CP at all.

While the projection optical system of each of the embodiments described above uses liquid to fill the optical space at the image plane (emission-face) side of the terminal optical element, it is also acceptable to use a projection optical system that fills liquid in an optical space on a physical face (incidence face) side of a terminal optical element, as disclosed in PCT International Publication No. WO 2004/019128.

While water is used as the liquid LQ for exposure in each of the embodiments described above, a liquid other than water can be used. For example, the liquid LQ for exposure can be perfluoropolyether (PFPE), a fluorinated fluid such as fluorinated oil, and cedar oil. A liquid having a refractive index of approximately 1.6 to 1.8 can be used as the liquid LQ.

The optical elements of the projection optical system PL that contact the liquid LQ (such as the final optical element FL) can be formed from, for example, quartz (silica), or a single-crystal fluoride compound such as calcium fluoride (fluorite), barium fluoride, strontium fluoride, lithium fluoride, and sodium fluoride. Moreover, the terminal optical element can be made from a material whose refractive index is higher than quartz and fluorite (e.g. 1.6 or higher). For example, it is possible to use sapphire, germanium dioxide, and the like as disclosed in PCT International Publication No. WO 2005/059617, or potassium chloride (refractive index=1.75) and the like as disclosed in PCT International Publication No. WO 2005/059618. Moreover, a thin film having affinity for the liquid and/or a dissolution-preventing function can be formed over all of part (including at least the face that contacts the liquid) of the surface of the terminal optical element. While quartz has high compatibility with liquid and does not require a dissolution-preventing film, for fluorite, at least a dissolution-preventing film can be formed. Examples of liquids with a higher refractive index than pure water (e.g. 1.5 or higher) are predetermined liquids having a C—H bond or an O—H bond such as isopropanol, which has a refractive index of approximately 1.50, and glycerol (glycerin) which has a refractive index of approximately 1.61, predetermined liquids (organic solvents) such as hexane, heptane, and decane, or decalin (decahydronaphthalene) which has a refractive index of approximately 1.60. Furthermore, the liquid can be a mixture of two or more types of liquids selected from those listed above, or an additive (mixture) formed by adding at least one of the above to pure water. Moreover, the liquid can be an additive (mixture) formed by adding acid or a base such as $H^+$, $C^+$, $K^+$, $Cl^-$, $SO_4^{2-}$, and $PO_4^{2-}$ to pure water, or an additive (mixture) formed by adding tiny particles of Al oxide and the like to pure water. It is preferable to use a liquid that has a low light-absorption coefficient, low temperature-dependency, and is stable with regard to photosensitive material (topcoat film or reflection-preventing film) applied to the surface of the substrate and/or the projection optical system. A topcoat film and the like for protecting the photosensitive material and the base material from the liquid can be applied to the substrate.

The substrate P of the embodiments described above is not limited to a semiconductor wafer for manufacturing a semiconductor device, it being possible to use a glass substrate for display device, a ceramic wafer for thin-film magnetic head, or an original plate (synthetic quartz, silicon wafer) for a reticle or a mask used in an exposure apparatus, a film member, and so on. The shape of the substrate is not limited to a disk, and can be rectangular or another shape.

As for the exposure apparatus EX, in addition to a scanning exposure apparatus using a step-and-scan method (scanning stepper) that scans the pattern of a mask M while synchronously moving the mask M and the substrate P, the invention can also be applied in a projection exposure apparatus using a step-and-repeat method (stepper) that exposes the pattern of the mask M in one shot while the mask M and the substrate P are stationary, and then sequentially moves the substrate P.

In exposure using the step-and-repeat method, it is acceptable to perform one-shot exposure in which, while a first pattern and the substrate P are substantially stationary, a projection optical system is used in transferring a compressed image of the first pattern to the substrate P; then, while a second pattern and the substrate P are substantially stationary, the projection optical system is used in partially superimposing a compressed image of the second pattern over the first pattern (switching method one-shot exposure apparatus).

As another type of switching method exposure apparatus, the invention can also be applied in an exposure apparatus using a step-and-switch method, where at least two patterns are transferred in partial superimposition onto the substrate P, and the substrate P is moved sequentially.

The invention can also be applied in multi-stage (twin-stage) exposure apparatuses including a plurality of substrate stages as disclosed in Japanese Patent Application, Publication No. H10-163099, Japanese Patent Application, Publication No. H10-214782 (corresponding U.S. Pat. Nos. 6,341,007, 6,400,441, 6,549,269, and 6,590,634), Published Japanese Translation No. 2000-505958 of the PCT International Application (corresponding U.S. Pat. No. 5,969,441), and the like.

Moreover, the invention can be applied in an exposure apparatus including a substrate stage that holds a substrate, and a measuring stage which a reference member which reference marks are formed on and/or various types of sensors are mounted on, as for example disclosed in Japanese Patent Application, Publication No. H11-135400, Japanese Patent Application, Publication No. 2000-164504 (corresponding U.S. Pat. No. 6,897,963), and the like.

While each of the above embodiments describes an example of an exposure apparatus including the projection optical system PL, the invention can also be applied in a exposure apparatus and an exposure method that do not use the projection optical system PL. When not using the projection optical system PL, exposure light is irradiated to the substrate via an optical member such as a lens, and an immersion space is formed in a predetermined space between the optical member and the substrate.

The type of the exposure apparatus EX is not limited to one for manufacturing semiconductor elements that exposures a semiconductor element pattern onto a substrate P, the invention being applicable in a wide range of exposure apparatuses such as an exposure apparatus for manufacturing a liquid crystal display element, an exposure apparatus for manufacturing a display, or an exposure apparatus for manufacturing a thin-film magnetic head, a charge coupled device (CCD), a micro machine, a micro-electromechanical system (MEMS), a DNA chip, a reticle, a mask, etc.

While each of the embodiments described above uses a light-transmitting mask where a predetermined light-intercepting pattern (or a phase pattern, a light-extinction pattern) is formed on a light-transmitting substrate, instead of this mask, it is possible to use an electronic mask that forms a transmitting pattern, a reflecting pattern, or a light-generating pattern, based on electronic data of a pattern to be exposed (also known as a variable-mold mask, including for example a digital micro-mirror device (DMD) which is one type of non-light-generating type image display element {also known as a spatial light modulator [SLM]}, etc.), such as disclosed in, for example, U.S. Pat. No. 6,778,257. An exposure apparatus using a DMD is disclosed in, for example, U.S. Pat. No. 6,778,257.

The invention can also be applied in an exposure apparatus (lithography system) that exposes a line and space pattern on a substrate P by forming an interference fringe on the substrate P, as disclosed in PCT International Publication No. WO 2001/035168.

The invention can also be applied in an exposure apparatus that synthesizes patterns of two masks using a projection optical system, and performs simultaneous double exposure of one shot region on a substrate in one scanning exposure operation, as disclosed, for example, in Published Japanese Translation No. 2004-519850 (corresponding U.S. Pat. No. 6,611,316) of the PCT International Application. It can also be applied in an exposure apparatus using a proximity method, a mirror projection aligner, and so on.

As far as is permitted, the disclosures in all of the Japanese Patent Publications and U.S. patents related to exposure apparatuses and the like cited in the above respective embodiments and modified examples, are incorporated herein by reference.

As described above, the exposure apparatuses EX of the embodiments are manufactured by assembling various types of subsystems including various constituent elements such as to have predetermined mechanical precision, electrical precision, and optical precision. To ensure these types of precision, adjustments for achieving optical precision in the various optical systems, adjustments for achieving mechanical precision in the various mechanisms, and adjustments for achieving electrical precision in the various electrical systems, are carried out before and after assembly. A step of assembly from the various subsystems to the exposure apparatus includes performing mechanical connection, interconnection of electrical circuits, piping connection of air pressure circuits, and so on, between the various subsystems. The subsystems themselves are, of course, assembled individually prior to this step of assembling them to the exposure apparatus. When the step of assembling the various subsystems to the exposure apparatus ends, general adjustments are made to ensure the various types of precision of the overall exposure apparatus. Preferably, the exposure apparatus is manufactured in a clean room where the temperature, level of cleanliness, and so on, are controlled.

Figure 15:
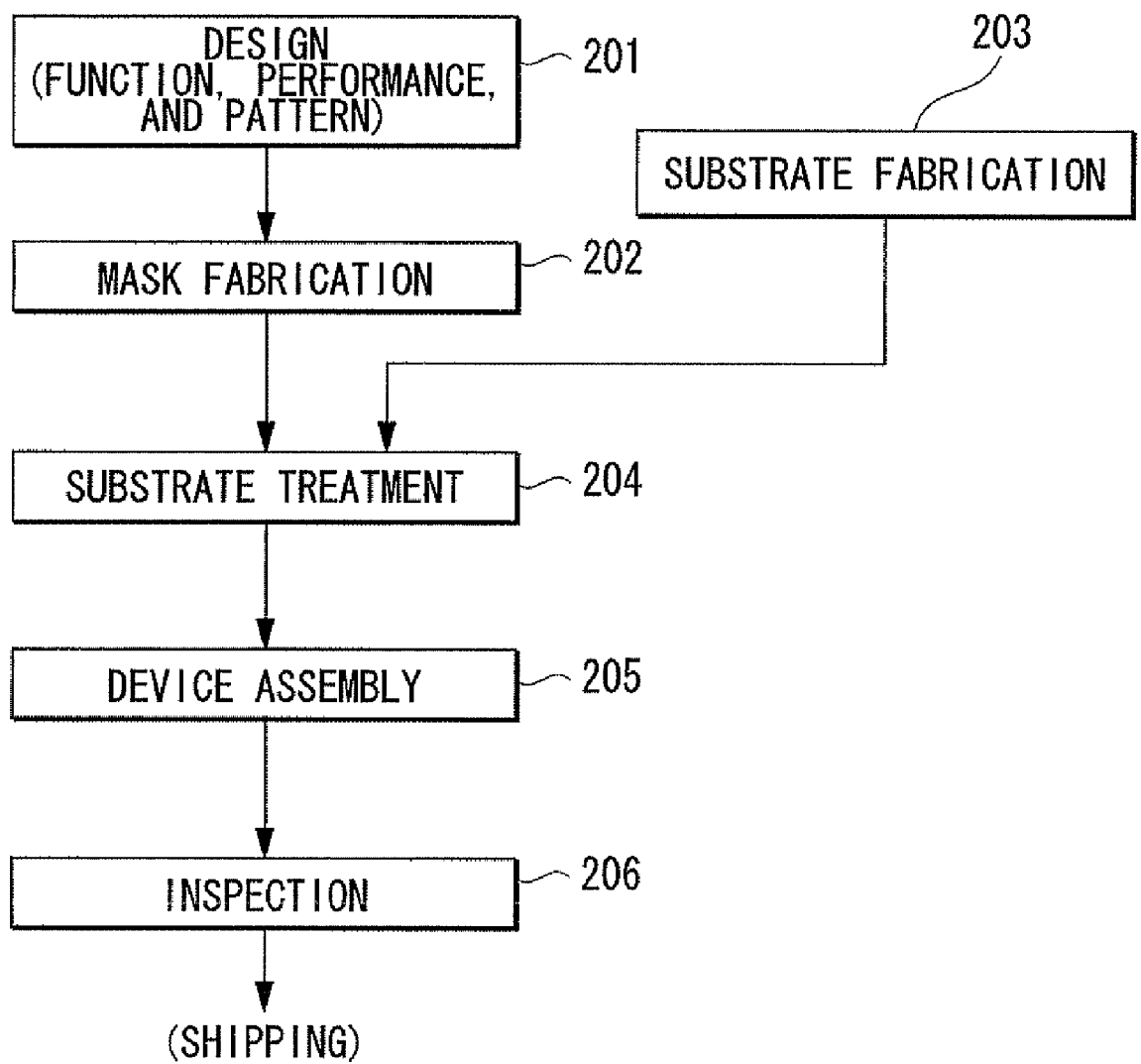
FIG. 15 is a flowchart of one example of manufacturing steps of micro device.

As shown in FIG. 15, a microdevice such as a semiconductor device is manufactured by performing a step 201 of designing functions and performance of a microdevice, a step 202 of manufacturing a mask (reticle) based on the design step, a step 203 of manufacturing a substrate that constitutes a base of the device, a substrate-processing step 204 including, in compliance with the embodiments described above, a substrate process (exposure process) of exposing the pattern of a mask onto a substrate and developing the exposed substrate, a device assembly step 205 (including work processes such as a dicing step, a bonding step, a packaging step, etc.), a test step 206, and so on.

According to the some aspects of the invention, a substrate-holding member can be properly cleaned. Therefore, a substrate properly held by the substrate-holding member can be properly exposed to light.

What is claimed is:

1. A cleaning method comprising:
holding a cleaning member with a substrate-holding member for holding a substrate while exposure light is irradiated onto the substrate in a photolithography process, without the substrate being held by the substrate-holding member, the cleaning member having substantially the same external shape as the substrate, and an outer diameter that is smaller than an outer diameter of the substrate so that a gap is provided from the outer diameter of the cleaning member to another member which surrounds the substrate when the substrate is held by the substrate-holding member; and
supplying a liquid to a space over the gap for cleaning at least part of the substrate-holding member.

2. The cleaning method according to claim 1, wherein the supplied liquid contacts a region of part of the substrate-holding member at an outer side of an edge of the cleaning member.

3. The cleaning method according to claim 2, wherein
the substrate-holding member comprises a first peripheral wall having a first top face that is opposite a peripheral region of a rear face of the substrate when the substrate-holding member is used to hold the substrate, and
said holding of the cleaning member causes the cleaning member to be held by the substrate-holding member such that at least part of the first top face of the first peripheral wall is opened to thereby contact the supplied liquid.

4. The cleaning method according to claim 3, wherein
the external shape of the cleaning member is substantially the same as the first peripheral wall,
the outer diameter of the cleaning member is smaller than an outer rim of the first peripheral wall so that said supplying causes said at least part of the first top face of the first peripheral wall to contact the supplied liquid, and
the cleaning member has substantially the same thickness as the substrate.

5. The cleaning method according to claim 4, wherein the outer diameter of the cleaning member is smaller than an inner rim of the first top face of the first peripheral wall so that said supplying causes said at least part of the first top face of the first peripheral wall to contact the supplied liquid.

6. The cleaning method according to claim 3, wherein
the substrate-holding member comprises a supporting member that is disposed at an inner side of the first peripheral wall for supporting a rear face of the substrate when the substrate-holding member is used to hold the substrate, and
when the substrate-holding member is used to hold the substrate, the supporting member supports the rear face of the substrate by creation of negative pressure in a space surrounded by the first peripheral wall.

7. The cleaning method according to claim 3, wherein
the substrate-holding member comprises a second peripheral wall arranged such as to surround the first peripheral wall, and
the region comprises a region between the first peripheral wall and the second peripheral wall.

8. The cleaning method according to claim 3, wherein the region comprises the first top face of the first peripheral wall.

9. The cleaning method according to claim 3, wherein
the substrate-holding member comprises a first suction hole that is formed at an outer side of the first peripheral wall and can suck liquid, and
the method further comprises:
causing the first suction hole to suck at least part of the supplied liquid.

10. The cleaning method according to claim 3, wherein
the substrate-holding member comprises a second suction hole that is formed at an inner side of the first peripheral wall and can suck liquid, and
the method further comprises:
causing the second suction hole to suck at least part of the supplied liquid.

11. The cleaning method according to claim 1, further comprising:
moving the substrate-holding member holding the cleaning member such that at least part of the substrate-holding member is opposite a liquid confinement member; and
forming a liquid immersion region with the supplied liquid between the cleaning member and the substrate-holding member, and the liquid confinement member.

12. The cleaning method according to claim 11, wherein the liquid is supplied to the space from a liquid supply port of the liquid confinement member.

13. The cleaning method according to claim 12, wherein the liquid confinement member comprises a liquid collection port, and
the method comprises:
performing, in parallel,
a liquid supply operation to supply the liquid from the liquid supply port and
at least part of a liquid collection operation to collect the supplied liquid via the liquid collection port.

14. The cleaning method according to claim 13, further comprising:
relatively moving the substrate-holding member holding the cleaning member and the liquid confinement member while performing the liquid supply operation from the liquid supply port and said at least part of the liquid collection operation via the liquid collection port in parallel.

15. The cleaning method according to claim 11, wherein the liquid confinement member comprises a liquid ejection hole, and the method further comprises:
forming a rapid flow of liquid in the liquid immersion region by ejection of the liquid from the liquid ejection hole.

16. The cleaning method according to claim 1, further comprising:
irradiating light having a photochemical cleaning function onto the substrate-holding member.

17. The cleaning method according to claim 16, wherein the light comprises the exposure light.

18. A device manufacturing method comprising:
holding a cleaning member with a substrate-holding member for holding a substrate while exposure light is irradiated onto the substrate in a photolithographic process, without the substrate being held by the substrate-holding member, the cleaning member having substantially the same external shape as the substrate, and an outer diameter that is smaller than an outer diameter of the substrate so that a gap is provided from the outer diameter of the cleaning member to another member which surrounds the substrate when the substrate is held by the substrate-holding member;
cleaning at least part of the substrate-holding member by supplying a liquid to a space over the gap;
after said cleaning, holding a substrate by use of the substrate-holding member; and
exposing the substrate held by the substrate-holding member with exposure light.

19. The device manufacturing method according to claim 18, wherein the supplied liquid contacts a region of part of the substrate-holding member at an outer side of an edge of the cleaning member.

20. The device manufacturing method according to claim 19, wherein
the substrate-holding member comprises a first peripheral wall having a first top face that is opposite a peripheral region of a rear face of the substrate when the substrate-holding member is used to hold the substrate, and
said holding of the cleaning member causes the cleaning member to be held by the substrate-holding member such that at least part of the first top face of the first peripheral wall is opened to thereby contact the supplied liquid.

21. The device manufacturing method according to claim 20, wherein
the external shape of the cleaning member is substantially the same as the first peripheral wall,
the outer diameter of the cleaning member is smaller than an outer rim of the first peripheral wall so that said supplying causes said at least part of the first top face of the first peripheral wall to contact the supplied liquid, and
the cleaning member has substantially the same thickness as the substrate.

22. The device manufacturing method according to claim 21, wherein the outer diameter of the cleaning member is smaller than an inner rim of the first top face of the first peripheral wall so that said supplying causes said at least part of the first top face of the first peripheral wall to contact the supplied liquid.

23. The device manufacturing method according to claim 20, wherein
the substrate-holding member comprises a supporting member that is disposed at an inner side of the first peripheral wall for supporting a rear face of the substrate, and
the supporting member supports the rear face of the substrate by creation of negative pressure in a space surrounded by the first peripheral wall.

24. The device manufacturing method according to claim 20, wherein
the substrate-holding member comprises a second peripheral wall arranged such as to surround the first peripheral wall, and
the region comprises a region between the first peripheral wall and the second peripheral wall.

25. The device manufacturing method according to claim 20, wherein the region comprises the first top face of the first peripheral wall.

26. The device manufacturing method according to claim 20, wherein
the substrate-holding member comprises a first suction hole that is formed at an outer side of the first peripheral wall and can suck liquid, and
the method further comprises:
causing the first suction hole to suck at least part of the supplied liquid.

27. The device manufacturing method according to claim 20, wherein the substrate-holding member comprises a second suction hole that is formed at an inner side of the first peripheral wall and can suck liquid, and the method further comprises:

causing the second suction hole to suck at least part of the supplied liquid.

28. The device manufacturing method according to claim 18, further comprising:

moving the substrate-holding member holding the cleaning member such that at least part of the substrate-holding member is opposite a liquid confinement member; and forming a liquid immersion region with the supplied liquid between the cleaning member and the substrate-holding member, and the liquid confinement member.

29. The device manufacturing method according to claim 28, wherein the liquid is supplied to the space from a liquid supply port of the liquid confinement member.

30. The device manufacturing method according to claim 29, wherein the liquid confinement member comprises a liquid collection port, and the method comprises:

performing, in parallel, a liquid supply operation to supply the liquid from the liquid supply port and, at least part of a liquid collection operation to collect the supplied liquid via the liquid collection port.

31. The device manufacturing method according to claim 30, further comprising:

relatively moving the substrate-holding member holding the cleaning member and the liquid confinement member while performing the liquid supply operation from the liquid supply port and said at least part of the liquid collection operation via the liquid collection port in parallel.

32. The device manufacturing method according to claim 28, wherein the liquid confinement member comprises a liquid ejection hole, and the method further comprises:

forming a rapid flow of liquid in the liquid immersion region by ejection of the liquid from the liquid ejection hole.

33. The device manufacturing method according to claim 18, further comprising:

irradiating light having a photochemical cleaning function onto the substrate-holding member.

34. The device manufacturing method according to claim 33, wherein the light comprises the exposure light.

* * * * *

UNITED STATES PATENT AND TRADEMARK OFFICE
CERTIFICATE OF CORRECTION

PATENT NO. : 7,927,428 B2
APPLICATION NO. : 11/851864
DATED : April 19, 2011
INVENTOR(S) : Yuichi Shibazaki Page 1 of 1

It is certified that error appears in the above-identified patent and that said Letters Patent is hereby corrected as shown below:

Title page Item [30] (Foreign Application Priority Data), Line 1 delete "P2006-24471" and insert -- 2006-244271 --, therefor.

Column 23, Line 33 in Claim 13, after "and" insert -- , --.

Column 23, Line 59 in Claim 18, delete "photolithographic" and insert -- photolithography --, therefor.

Signed and Sealed this
Twelfth Day of July, 2011

David J. Kappos
*Director of the United States Patent and Trademark Office*